(12) United States Patent
Yuzurihara et al.

(10) Patent No.: US 9,450,519 B2
(45) Date of Patent: Sep. 20, 2016

(54) DC POWER SOURCE, AND DC POWER SOURCE CONTROL METHOD

(71) Applicant: KYOSAN ELECTRIC MFG. CO., LTD., Yokohama-shi, Kanagawa (JP)

(72) Inventors: Itsuo Yuzurihara, Yokohama (JP); Shinichi Kodama, Yokohama (JP); Toshiyuki Adachi, Yokohama (JP)

(73) Assignee: KYOSAN ELECTRIC MFG. CO., LTD., Yokohama-shi (JP)

( * ) Notice: Subject to any disclaimer, the term of this patent is extended or adjusted under 35 U.S.C. 154(b) by 0 days.

(21) Appl. No.: 14/765,702

(22) PCT Filed: Dec. 26, 2013

(86) PCT No.: PCT/JP2013/084823
§ 371 (c)(1),
(2) Date: Aug. 4, 2015

(87) PCT Pub. No.: WO2015/045197
PCT Pub. Date: Apr. 2, 2015

(65) Prior Publication Data
US 2016/0204698 A1 Jul. 14, 2016

(30) Foreign Application Priority Data

Sep. 27, 2013 (JP) ................................. 2013-201953

(51) Int. Cl.
*H02M 7/5387* (2007.01)
*H02M 3/158* (2006.01)
(Continued)

(52) U.S. Cl.
CPC ........... *H02M 7/53871* (2013.01); *H02M 1/36* (2013.01); *H02M 3/1582* (2013.01); *H05H 1/46* (2013.01); *H02M 3/155* (2013.01); *H02M 2001/007* (2013.01)

(58) Field of Classification Search
CPC ........... H02M 2001/007; H02M 1/36; H02M 3/155; H02M 3/156; H02M 3/15; H02M 3/1582; H02M 7/4826; H02M 7/538718; H05H 1/46

See application file for complete search history.

(56) References Cited

U.S. PATENT DOCUMENTS

2001/0042739 A1* 11/2001 Mela .................... B23K 9/1043
219/130.1
2008/0048586 A1* 2/2008 Hasegawa .......... H05B 41/2883
315/307
(Continued)

FOREIGN PATENT DOCUMENTS

JP         11-229138 A      8/1999
JP        2002-173772 A     6/2002
(Continued)

OTHER PUBLICATIONS

Search Report dated Sep. 27, 2015, issued in the counterpart Taiwanese Application No. 103105210 (1 page).
(Continued)

*Primary Examiner* — Fred E Finch, III
(74) *Attorney, Agent, or Firm* — Westerman, Hattori, Daniels & Adrian, LLP

(57) ABSTRACT

A DC power source to supply DC power to a plasma generator is configured as a simple and small-sized device that forms high voltage for generating a plasma discharge. A step of passing a short-circuit current for extremely short time through the voltage source step-down chopper provided in the DC power source and accumulating energy in a reactor is performed repeatedly more than once, so as to discharge the energy accumulated in the reactor to the output capacitance and raise the output voltage sequentially, thereby boosting the voltage up to the ignition set voltage. The short-circuit current is formed by a switching element of a boosting circuit provided in the DC power source. Boosting the voltage at the output terminal by accumulating and discharging the short-circuit current is repeated to raise the voltage at the output terminal of the DC power source up to the ignition set voltage.

9 Claims, 13 Drawing Sheets

(51) Int. Cl.
  *H05H 1/46*   (2006.01)
  *H02M 1/36*   (2007.01)
  *H02M 3/155*    (2006.01)
  *H02M 1/00*     (2006.01)

(56) References Cited

U.S. PATENT DOCUMENTS

| | | | |
|---|---|---|---|
| 2009/0168460 A1* | 7/2009 | Huang | H02M 1/4233 363/17 |
| 2010/0259195 A1* | 10/2010 | Kamoi | H05B 41/2925 315/307 |
| 2011/0120860 A1* | 5/2011 | Horishita | H01J 37/3417 204/298.08 |
| 2012/0069613 A1* | 3/2012 | Nakagawa | H02M 7/53871 363/78 |
| 2014/0211530 A1* | 7/2014 | Chen | H02M 7/53871 363/132 |
| 2015/0180346 A1* | 6/2015 | Yuzurihara | H01T 1/02 315/127 |
| 2015/0195896 A1* | 7/2015 | Yuzurihara | H05H 1/46 315/111.21 |
| 2016/0141971 A1* | 5/2016 | Yuzurihara | H02M 3/1582 363/37 |

FOREIGN PATENT DOCUMENTS

| | | |
|---|---|---|
| JP | 2005-50711 A | 2/2005 |
| JP | 2005-050711 A | 2/2005 |
| JP | 2006-006053 A | 1/2006 |
| JP | 2006-6053 A | 1/2006 |
| JP | 2010-225308 A | 10/2010 |
| JP | 2010-255061 A | 11/2010 |
| TW | 465261 B | 11/2001 |
| TW | 201028051 A | 7/2010 |
| TW | 201336354 A | 9/2013 |
| WO | 2013-125004 A1 | 8/2013 |
| WO | 2014/038060 A1 | 3/2014 |

OTHER PUBLICATIONS

Search Report dated Sep. 27, 2015, issued in the counterpart Taiwanese Application No. 103105210, with English translation (3 page).
International Search Report dated Apr. 1, 2014, issued in counterpart Application No. PCT/JP2013/084823 (2 pages).
Written Opinion dated Apr. 1, 2014, issued in counterpart Application No. PCT/JP2013/084823, with English translation (7 pages).

* cited by examiner

DURING SHORT-CIRCUIT

END OF SHORT-CIRCUIT

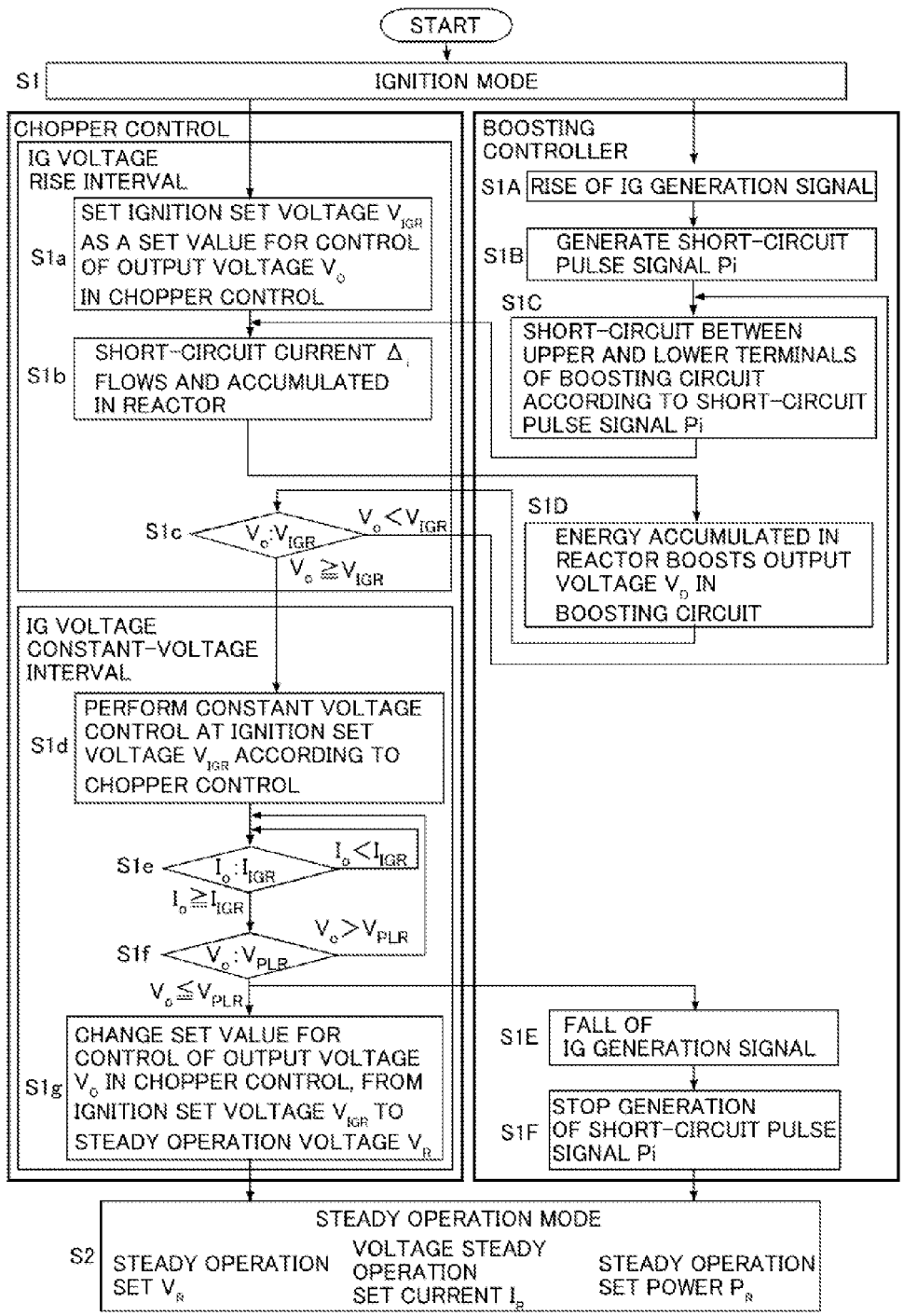

| | | IGNITION MODE | | SWITCHING OPERATION | STEADY OPERATION MODE |
|---|---|---|---|---|---|
| | | IG VOLTAGE RISE INTERVAL | IG VOLTAGE CONSTANT-VOLTAGE INTERVAL | | |
| FIRST MODE | CHOPPER CONTROL | SWITCHING ELEMENT $Q_1$: PULSE WIDTH CONTROL | SWITCHING ELEMENT $Q_1$: CONSTANT VOLTAGE CONTROL AT IGNITION SET VOLTAGE $V_{IGR}$ | CHANGE SETTINGS $V_{IGR} \rightarrow V_R$ | SWITCHING ELEMENT $Q_1$: PULSE WIDTH CONTROL |
| | BOOSTING CONTROL | SWITCHING ELEMENT $Q_2$: INTERMITTENT DRIVE | SWITCHING ELEMENT $Q_2$: INTERMITTENT DRIVE | | SWITCHING ELEMENT $Q_2$: OFF |
| | CHOPPER CONTROL | SWITCHING ELEMENT $Q_1$: PULSE WIDTH CONTROL | SWITCHING ELEMENT $Q_1$: PULSE WIDTH CONTROL | | SWITCHING ELEMENT $Q_1$: PULSE WIDTH CONTROL |
| | BOOSTING CONTROL | SWITCHING ELEMENT $Q_2$: INTERMITTENT DRIVE | SWITCHING ELEMENT $Q_2$: OFF | | SWITCHING ELEMENT $Q_2$: OFF |
| SECOND MODE | INVERTER CONTROL | INVERTER CONTROL $Q_u, Q_v, Q_x, Q_y$ ON | SWITCHING ELEMENTS $Q_u, Q_v, Q_x, Q_y$ ON | | SWITCHING ELEMENTS $Q_u, Q_v, Q_x, Q_y$ ON |
| | OUTPUT CURRENT | SET CURRENT: IGNITION SET CURRENT $I_{IGR}$ OUTPUT CURRENT $I_O$: 0 → IGNITION SET CURRENT $I_{IGR}$ | SET CURRENT: IGNITION SET CURRENT $I_{IGR}$ OUTPUT CURRENT $I_O$: 0 → IGNITION SET CURRENT $I_{IGR}$ | | OUTPUT CURRENT $I_O$ |
| | OUTPUT VOLTAGE | SET VOLTAGE: IGNITION SET VOLTAGE $V_{IGR}$ OUTPUT VOLTAGE $V_O$: 0 → $V_{IGR}$ | SET VOLTAGE: IGNITION SET VOLTAGE $V_{IGR}$ OUTPUT VOLTAGE $V_O$: MAINTAINED AT $V_{IGR}$ | $V_{IGR} \rightarrow V_R$ | SET VOLTAGE: STEADY OPERATION SET VOLTAGE $V_R$ OUTPUT VOLTAGE $V_O$: MAINTAINED AT $V_R$ |

FIG. 9

DC POWER SOURCE, AND DC POWER SOURCE CONTROL METHOD

TECHNICAL FIELD

The present invention relates to a direct current (DC) power source, and for example, it relates to a DC power source used for a load such as a plasma generator, and a DC power source control method.

BACKGROUND ART

There is known a plasma treatment step which applies plasma to a processing object such as a substrate, in manufacturing a semiconductor device, a liquid crystal panel, a disk, or the like, or in a sputtering process, and the like. In this plasma treatment step, a direct current (DC) power source supplies a plasma generator with DC power, thereby allowing processed gas to be plasmatized, or the like, in the space within the plasma generator, so as to generate plasma, and using thus generated plasma, a film forming process or an etching process is performed on a surface of the substrate.

Typically, the plasma generator corresponds to an electrical load when viewed from the DC power source, and the load at a starting point for generating a plasma discharge before the plasma discharge is actually generated, is different from the load during a normal operation when the plasma discharge is generated stably. Therefore, usually, upon starting the plasma discharge, the DC power source applies ignition voltage which is higher than the voltage for the normal operation, for a certain period of time, and thereafter applies low discharge voltage during the period of the normal operation (Patent Document 1). In addition, it is known that starting of the plasma discharge is detected by incoming current (Patent Documents 2 and 3).

As a circuit for generating the ignition voltage for the plasma discharge generation, there is known a circuit using a resonant converter or a circuit using chopper control.

FIG. 13A and FIG. 13B each illustrates an ignition voltage generation circuit using the resonant converter; FIG. 13A illustrates a circuit example of a series resonant converter, and FIG. 13B illustrates a circuit example of a parallel resonant converter. In the circuit example as shown in FIG. 13A, the series resonant circuit LC is connected between an inverter circuit and a converter made up of a diode rectifier circuit, and in the circuit example as shown in FIG. 13B, the parallel resonant circuit LC is connected between the inverter circuit and the converter made up of the diode rectifier circuit. The ignition voltage generation circuit using the resonant converter boosts the ignition voltage by resonance.

FIG. 13C is a circuit example of the chopper control, and a chopper circuit is provided between a DC source (Ein) and the inverter circuit. In the circuit for the chopper control, the ignition voltage is controlled by an on-duty cycle of a switching element provided in the chopper circuit.

PRIOR ART DOCUMENT

Patent Document

Patent Document 1
Japanese Unexamined Patent Application Publication No. 2010-255061 (Paragraph [0006])
Patent Document 2
Japanese Unexamined Patent Application Publication No. 11-229138 (Paragraph [0009])
Patent Document 3
Japanese Unexamined Patent Application Publication No. 2002-173772 (Paragraph [0032])
Patent Document 4
International Patent Application PCT/JP2012/72854

DISCLOSURE OF THE INVENTION

Problem to be Solved by the Invention

In the device as described in the Patent Document 2, plasma is generated by applying voltage higher than preset discharge voltage, for a certain period of time. In the device as described in the Patent Document 3, the plasma discharge is ignited by instantaneously applying voltage at a rated value or higher.

As described above, the voltage to be applied for igniting plasma is higher than the discharge voltage or the rated voltage, and it is applied for a certain period or instantaneously. Since there is variability in generation of plasma discharge, it is necessary to set the application time to be longer if the applied voltage is low.

In order to generate the plasma discharge reliably within a short application time, it is necessary to generate voltage higher than the discharge voltage or the rated voltage.

Therefore, there is a problem that the DC power source for supplying DC power to the plasma generator may end up as an intricate and oversized device so as to increase the voltage used for generating the plasma discharge.

In the case where the plasma discharge is made to arise using low application voltage, the application time is likely to become longer. Therefore, there is a problem that the processing time in the plasma generator becomes longer.

On the other hand, in the ignition voltage generation circuit, as indicated by the examples shown in FIG. 13A and FIG. 13B, if the series resonant converter and the parallel resonant converter are employed, the voltage is boosted according to resonance operation. Therefore, there is a problem that a maximum value of the boosted ignition voltage is only twice as high as the input DC voltage Edc. In order to raise the ignition voltage, it is necessary to raise the input DC voltage Edc, and therefore, preparation of high-voltage DC source is required.

In the ignition voltage generation circuit as indicated by the example shown in FIG. 13C, if the chopper control is performed, the inverter circuit is not provided with any resonant circuit. Therefore, there is a problem that in the step-down chopper circuit, an obtainable maximum value of the ignition voltage is only up to the input DC voltage Ein.

Therefore, also in the ignition voltage generation circuit according to the resonant circuit or the chopper circuit, there is a problem that the DC power source may end up as an intricate and oversized device so as to increase the voltage used for generating the plasma discharge.

In order to solve the aforementioned problems, the inventors of the present application suggest one solution of the DC power source that is established by combining a current source type step-down chopper circuit and a three-phase inverter circuit (Patent Document 4). In the solution being suggested, in order to form short-circuit current in the current source step-down chopper circuit, a configuration is suggested to control switching operation in a multi-phase inverter connected to the load side of the current source type step-down chopper circuit, thereby forming the short-circuit current, or a configuration is suggested to provide a single switching circuit between the terminals on the output side of the current source type step-down chopper circuit, thereby forming the short-circuit current.

In the aforementioned suggestions, when the short-circuit current is formed by controlling the switching operation of the multi-phase inverter, short-circuit control is performed in controlling the three-phase inverter, according to the switching operation that short-circuits and open-circuits the upper and lower terminals, in addition to the inverter control normally performed. Alternatively, when the short-circuit current is formed by the configuration where the switching circuit is provided, a circuit configuration only aiming at short-circuiting the upper and lower terminals is provided separately.

An object of the present invention is to solve the aforementioned conventional problems, and it is directed to simplification and down-sizing of a device structure to form high voltage that allows generation of plasma discharge, in the DC power source for supplying DC power to the plasma generator.

Another object is to reduce the time length for applying voltage which is required to generate the plasma discharge, without using a DC power source having an oversized and intricate configuration.

Means to Solve the Problem

When DC power is supplied to a load such as a plasma generator to perform plasma treatment, there is a step to be carried out for generating plasma discharge in the plasma generator, at the time of power activation or restarting. At this timing, a DC power source applies voltage called as ignition voltage to the plasma generator, the ignition voltage being higher than the voltage being applied during a normal operation, and then the plasma discharge is generated.

The present invention relates to the DC power source that is used to generate voltage to be applied to the plasma generator, so as to generate a plasma discharge, and a DC power source control method.

It is necessary to boost the voltage to be applied to the plasma generator, up to the ignition set voltage that is required to generate the plasma discharge. The DC power source of the present invention performs more than once, a step of passing short-circuit current through a voltage source step-down chopper provided in the DC power source only for an extremely short time, and accumulating energy in a reactor, so as to discharge the energy accumulated in the reactor to the output capacitance and boost the output voltage sequentially, thereby boosting the voltage up to the ignition set voltage.

The DC power source of the present invention has a configuration to form the short-circuit current by using the switching element provided in a boosting circuit. The switching element is closed only for an extremely short time, thereby establishing a short circuit between the upper and lower terminals on the output side of the voltage source step-down chopper, and a current path from the voltage source step-down chopper to the output terminal of the DC power source is interrupted only for the extremely short time. The short circuit of the boosting circuit interrupts the current path to the output terminal of the DC power source, and then, the current passing so far through the voltage source step-down chopper runs within the voltage source step-down chopper and the boosting circuit in the form of shirt-circuit current. The short-circuit current is temporarily accumulated in the reactor that is provided in the voltage source step-down chopper.

Thereafter, when the short circuit is released by using the switching element of the boosting circuit, and the interruption of the current path is canceled, a current path from the voltage source step-down chopper directed to the output terminal of the DC power source is provided again. Then, the energy accumulated in the reactor boosts the voltage at the output terminal of the DC power source. Boosting at the output terminal caused by accumulation and releasing of the current are repeated, thereby boosting the voltage at the output terminal of the DC power source up to the ignition set voltage.

[DC Power Source]

The present invention is directed to a DC power source configured to supply DC power to a plasma generator, the device including a voltage source step-down chopper forming a source of DC voltage, a boosting circuit configured to boost the DC voltage of the voltage source step-down chopper, a single phase inverter configured to convert DC output from the boosting circuit into a single-phase AC, and a controller, and the controller includes a chopper controller configured to control the voltage source step-down chopper, and a boosting controller configured to control the boosting circuit.

[DC Power Source Control Method]

The present invention is directed to a DC power source control method configured to supply DC power to a plasma generator, including a voltage source step-down chopper forming a source of DC voltage, a boosting circuit configured to boost the DC voltage of the voltage source step-down chopper, a single-phase inverter configured to convert DC output from the boosting circuit into a single phase AC, and a controller including a chopper controller configured to control the voltage source step-down chopper and a boosting controller configured to control the boosting circuit.

The controller performs a control operation by switching between an ignition mode to supply ignition voltage for generating a plasma discharge in the plasma generator, and a steady operation mode to continue the plasma discharge of the plasma generator.

In the ignition mode, the boosting controller intermittently establishes a short circuit between the positive voltage side and the negative voltage side of the boosting circuit, controls a boosting operation according to a short-circuit current formed by this intermittent short circuiting, and further controls output voltage to be applied to the plasma generator.

The boosting controller generates a short-circuit pulse signal that establishes the short circuit intermittently in the switching element that connects the positive voltage terminal and the negative voltage terminal in the boosting circuit. This short-circuit pulse signal sets the switching element to be on-state, thereby establishing the short circuit between the positive voltage terminal and the negative voltage terminal of the output terminal of the voltage source step-down chopper.

In the ignition mode, the controller performs the boosting control and the constant voltage control, by switching therebetween. The boosting controller performs the boosting control, repeating more than once the boosting according to the short-circuit current, and raises the output voltage up to the ignition set voltage. On the other hand, the chopper controller performs the constant voltage control, and maintains the output voltage at the ignition set voltage.

After the output voltage reaches the ignition set voltage, the controller performs switching from the boosting control to the constant voltage control.

As parameters, the controller is provided with an on-duty cycle in the chopper control by the chopper controller, and the number of the intermittent short-circuit operations.

The chopper controller controls input voltage of the voltage source step-down chopper, according to the on-duty cycle. On the other hand, the boosting controller controls a boosting ratio, according to the number of the intermittent short-circuit operations. The rise of the output voltage is controlled by the input voltage and the boosting ratio.

In the steady operation mode, any of the following controls is selectable; constant voltage control, constant current control, and constant power control. When output current reaches an ignition set current and the output voltage goes down to plasma generation voltage in the switching control, the controller switches the mode from the ignition mode to the steady operation mode, and then, any of the control selected from the constant voltage control, the constant current control, and the constant power control is performed.

The constant voltage control is a voltage control, performed by switching a set value for the steady operation, from the ignition set voltage that is set in the ignition mode, to a steady operation set voltage, and then, the output voltage is maintained at the steady operation set voltage.

The constant current control is a current control, performed by switching the set value for the steady operation, from the ignition set voltage in the ignition mode, to a steady operation set current, thereby maintaining the output current at the steady operation set current.

The constant power control is a power control, performed by switching the set value for the steady operation, from the ignition set voltage in the ignition mode, to steady operation set power thereby maintaining the output power at the steady operation set power.

As described in the aforementioned suggestions, when the switching operation is controlled by the multi-phase inverter, the short-circuit control is performed by the switching operation that establishes and releases the short circuit between the upper and lower terminals, in addition to the normal inverter control in the three-phase inverter. On the other hand, according to the present invention, a normal inverter control is performed in a single-phase inverter, and as for the short-circuit control, the inverter control is not necessary, but it is achieved according to the short-circuit control by the boosting circuit that is independent of the normal inverter control.

Furthermore, as described in the aforementioned suggestions, in the configuration where the switching circuit is provided, a short circuit only aiming at establishing the short-circuit between the upper and lower terminals is provided separately. On the other hand, according to the present invention, it is possible to perform the short-circuit control by using the switching element provided in the boosting circuit. Therefore, it is not necessary to prepare the short circuit separately.

Effect of the Invention

As explained so far, according to the present invention, it is possible to simplify and downsize a device configuration which forms high voltage to generate plasma discharge, in the DC power source for supplying DC power to the plasma generator.

In addition, it is possible to reduce voltage application time required for generating the plasma discharge, without using the DC power source having an oversized and intricate configuration.

BRIEF DESCRIPTION OF DRAWINGS

FIG. 6 is a flow chart for explaining an operation example of the ignition mode and the steady operation mode of the DC power source according to the present invention;

FIG. 9 illustrates an operating state of the ignition mode and the steady operation mode of the DC power source, according to the present invention;

MODE FOR CARRYING OUT THE INVENTION

FIG. 1 illustrates an operation for generating short-circuit current and an operation for boosting output voltage by the short-circuit current, according to the present invention.

Figure 1A:
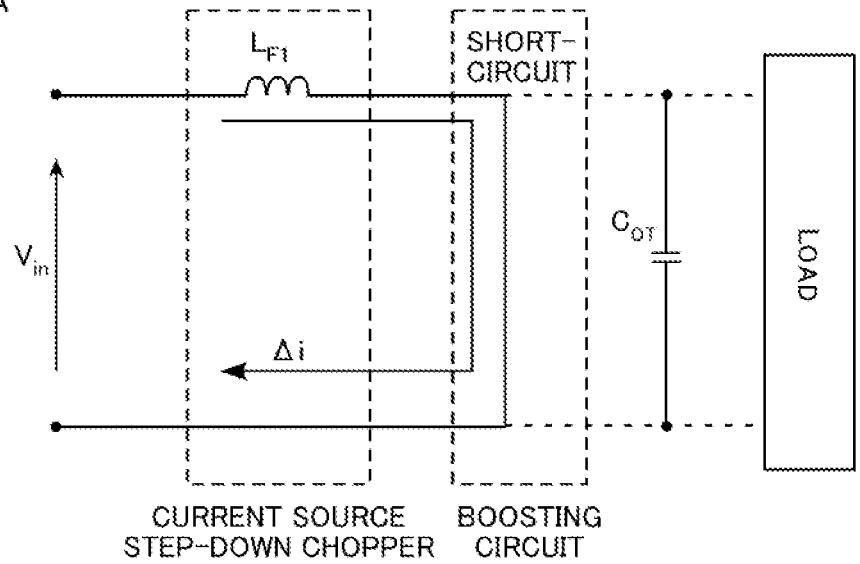
FIGS. 1A and B illustrate an operation for generating a short-circuit current and an operation for boosting output voltage by the short-circuit current, according to the present invention.

FIG. 1A illustrates the operation for generating the short-circuit current. In the boosting circuit, a short-circuit is established between the positive voltage side and the negative voltage side. According to this short-circuit, the current path from the voltage source step-down chopper to the output terminal of the DC power source is interrupted only for an extremely short time, and this allows the short-circuit current $\Delta_i$ to pass through the voltage source step-down chopper and the boosting circuit. The short-circuit current is temporarily accumulated in the reactor $L_{F1}$ that is provided in the voltage source step-down chopper.

Figure 1B:
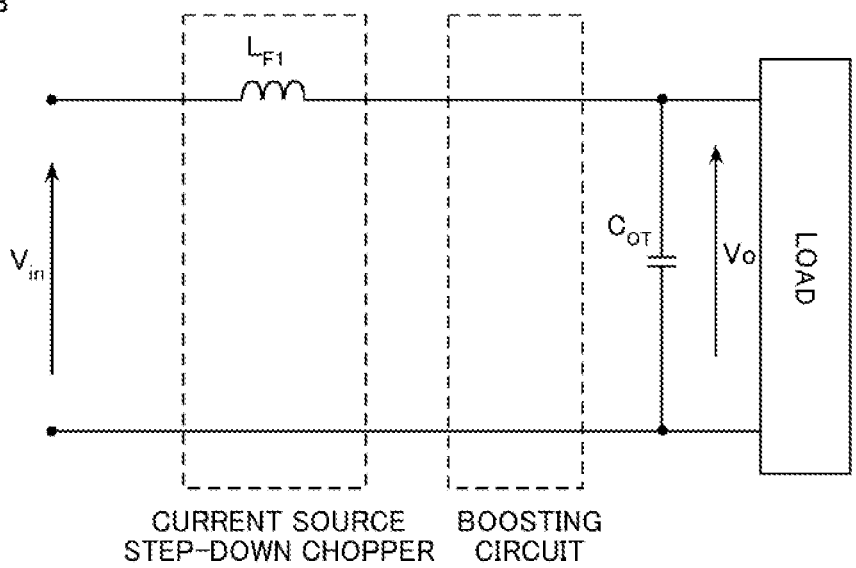

FIG. 1B illustrates an operation for boosting the output voltage. When the short-circuit operation as shown in FIG. 1A is suspended and the voltage source step-down chopper and the boosting circuit are connected to the load side, the energy accumulated in the DC reactor $L_{F1}$ is converted into voltage, thereby boosting the output voltage. In FIG. 1B, the voltage $V_o$ of the output capacitance $C_{OT}$ is boosted.

It is to be noted here that the output capacitance $C_{OT}$ corresponds to capacitance of a chopper output capacitor $C_{F1}$. When the load is provided with load capacitance $C_L$, the output capacitance $C_{OT}$ corresponds to the capacitance of a parallel circuit of the chopper output capacitor $C_{F1}$ and the load capacitance $C_L$. In FIG. 1, the chopper output capacitor $C_{F1}$ and the load capacitance $C_L$ are not illustrated.

The DC power source of the present invention accumulates in the DC reactor $L_{F1}$, the short-circuit current passing through the voltage source step-down chopper according to the short-circuit in the boosting circuit, and converts the accumulated current into the energy to boost the output voltage. Since an amount of boosted voltage obtained by a single short-circuit is small, the step of boosting according to the short circuit is repeated more than once, thereby raising the output voltage gradually up to the ignition set voltage. It is possible to increase the amount of the boosted voltage according to the single short-circuit, by extending a short-circuit time period when the positive voltage side and the negative voltage side are short-circuited. In this case, the smaller is the amount of boosted voltage for one time, a range of boosting is adjustable in the smaller increments, thereby enhancing resolution performance of the voltage boost, and it is advantageous in controlling the output voltage.

A current path for an extremely short time through the voltage source step-down chopper and the boosting circuit may be established, by simply short-circuiting between the positive voltage side and the negative voltage side of the boosting circuit, and this allows the use of the boosting circuit provided in the DC power source. Therefore, it is possible to achieve a simple and small-sized configuration.

The DC power source of the present invention for supplying DC power to the plasma generator is provided with the voltage source step-down chopper configured to form a DC source, the boosting circuit to boost DC output from the voltage source step-down chopper, a single-phase inverter configured to convert the DC output from the boosting circuit into single-phase AC power according to an operation of a switching element, and a controller.

The controller includes a chopper controller configured to control the voltage source step-down chopper, a boosting controller configured to control the boosting circuit by short-circuiting, and an inverter controller configured to control the single-phase inverter. Those controllers perform the following control operations; a switching control to switch the operation mode, a boosting control to intermittently short-circuit the boosting circuit and provide a current path for an extremely short time in the circuit of the voltage source step-down chopper, a chopper control of the voltage source step-down chopper, an inverter control of the single-phase inverter, and the like.

The switching control performs switching between operation modes; an ignition mode for supplying ignition voltage which generates a plasma discharge in the plasma generator, and a steady operation mode for supplying steady operation current to continue the plasma discharge in the plasma generator.

The boosting controller controls the boosting circuit. The boosting control causes intermittent short-circuit between the positive voltage side and the negative voltage side of the boosting circuit, and forms the current path only for an extremely short time in the voltage source step-down chopper and the boosting circuit, so as to pass the short-circuit current therethrough. Energy of the short-circuit current is accumulated in the reactor of the voltage source step-down chopper. The short-circuit operation is performed at every short-circuit pulse signal, for an extremely short time, and plural short-circuit pulse signals are intermittently inputted, thereby performing the short-circuit operations more than once.

In the intermittent short-circuit operations, from when one short-circuit operation is completed until the next short-circuit operation starts, the voltage source step-down chopper becomes conductive with the output terminal of the DC power source. Accordingly, the energy accumulated in the reactor is transferred to the output terminal of the DC power source, and this boosts the output voltage.

Each short-circuit operation is performed on the basis of each short-circuit pulse signal, and the short-circuit current is reset for each short-circuit operation.

In the boosting control, when the short-circuit operation is performed to establish a short circuit between the positive voltage side and the negative voltage side of the boosting circuit, the flow of the current from the voltage source step-down chopper and the boosting circuit to the single-phase inverter is suspended. Therefore, the short-circuit current is formed in the boosting circuit and the voltage source step-down chopper, without affected by the DC-AC conversion according to the single-phase inverter.

The controller performs the control operations using as parameters, the on-duty cycle of the chopper control by the chopper controller, and the number of the intermittent short-circuit operations. The input voltage of the voltage source step-down chopper is controlled by the on-duty cycle, the boosting ratio is controlled by the number of intermittent short-circuit operations, and a rise of the output voltage is controlled by the input voltage of the voltage source step-down chopper and the boosting ratio.

(Ignition Mode)

The controller performs switching between the boosting control and the constant voltage control in the ignition mode; the boosting control repeats boosting by the short-circuit current more than once and raises the output voltage up to the ignition set voltage, and the constant voltage control maintains the output voltage at the ignition set voltage by the chopper controller. Switching from the boosting control to the constant voltage control is performed at the point when the output voltage reaches the ignition set voltage.

The controller performs the boosting control in the ignition mode, thereby passing the short-circuit current through the boosting circuit and the voltage source step-down chopper. The energy of the short-circuit current is temporarily accumulated in the reactor provided in the voltage source step-down chopper. The energy being accumulated boosts the output voltage in the DC power source via the single-phase inverter, during the period until the next short circuiting. This accumulation of the current energy by the short-circuiting and the boosting operation that repeats boosting the output voltage by conduction may achieve a control operation to increase the output voltage applied to the plasma generator.

In the ignition mode, the output voltage from the DC power source is determined by the boosted voltage according to the short-circuit operations more than once and the input voltage in the voltage source step-down chopper, being determined by the chopper control. In addition, the number of short circuit operations, being required to boost the voltage up to the ignition set voltage, is able to be determined based on the configuration of the DC power source and usage conditions thereof, since the number of short circuit operations has relevance to the input voltage of the voltage source step-down chopper, duration of the ignition mode, an amount of voltage boosted by a single short-circuit operation, and the like.

The output voltage is raised up to a predetermined ignition set voltage according to the boosting control, and after reaching the ignition set voltage, it is maintained according to the constant voltage control. With this configuration, voltage gradually boosted is applied to the plasma generator during the ignition mode, and after reaching the ignition set voltage, the ignition set voltage is applied until the end of the ignition mode.

In the ignition mode, the chopper controller performs pulse width control, and controls the input voltage of the voltage source step-down chopper to become a predetermined voltage.

(Steady Operation Mode)

According to the constant voltage control in the ignition mode, when the output current reaches the ignition set current and the output voltage drops to plasma generation voltage, the ignition mode is switched to the steady operation mode, and any of the following control; constant voltage control, constant current control, constant power control, is selected and performed.

The constant voltage control is a control mode where a set value of the steady operation is switched from the ignition set voltage that is set in the ignition mode, to the steady operation set voltage, and the output voltage is maintained at the steady operation set voltage.

The constant current control is a control mode where the set value of the steady operation is switched from the ignition set voltage set in the ignition mode, to the steady operation set current, and the output current is maintained at the steady operation set current.

The constant power control is a control mode where the set value of the steady operation is switched from the ignition set voltage set in the ignition mode, to the steady operation set power, and the output power is maintained at the steady operation set power.

Switching from the ignition mode to the steady operation mode is performed when the plasma discharge is generated in the plasma generator, according to the output current and the output voltage. Typically, generation of plasma discharge increases the output current, and drops the output voltage from the voltage at the ignition time. A level of the output voltage and a level of the output current are detected, from the DC power source to the plasma generator, thereby detecting the generation of the plasma discharge, and this allows switching from the ignition mode to the steady operation mode.

When the plasma discharge is generated in the plasma generator, the output current supplied from the DC power source to the plasma generator is switched from the ignition current to the steady operation current, at the time when the ignition mode is switched to the steady operation mode.

Since the ignition current increases by stages at every intermittent short-circuit operation, the ignition current becomes the maximum at the last stage when the ignition mode is switched to the steady operation mode. Here, the ignition current at the time when the ignition mode is switched to the steady operation mode is obtained in advance, and it is defined as ignition set current. In addition, when the plasma discharge is generated, the output voltage becomes a value lower than the ignition set voltage, and therefore, the lower voltage at the time of generation of the plasma discharge is defined as plasma generation voltage.

In detecting the generation of the plasma discharge, the output current is compared with the ignition set current, and the output voltage is compared with the plasma generation voltage. The time when the output current reaches the ignition set current and the output voltage drops to the plasma generation voltage is determined as a point of time when the plasma discharge is generated.

When the generation of plasma discharge is detected, the set value for the control is switched from the ignition set voltage of the constant voltage control in the ignition mode, to a set value of any of the control in the steady operation mode, selected from the constant voltage control, the constant current control, and the constant power control. Then, the selected control is performed.

In the steady operation mode, according to any of the control; the constant voltage control, the constant current control, and the constant power control, any of the constant voltage, constant current and constant power is applied to the plasma generator, thereby maintaining stable plasma discharge.

The current path from the voltage source step-down chopper to the output terminal side is able to be assumed as the path passing through each the following parts; the single-phase inverter, a transformer, and a rectifier, which are connected to the DC power source. In addition, it may also be assumed as the path that directly connects the voltage source step-down chopper and the output terminal side. In the configuration that uses this path directly connected, there is provided a means to switch between the conducting state in the ignition mode, and the non-conducting state in the steady operation mode.

The inverter controller generates a gate pulse signal that applies pulse width control to the switching elements of the bridge circuit constituting the single-phase inverter. The gate pulse signal controls each of the switching elements on and off in the bridge circuit of the single-phase inverter, so as to convert direct current into alternating current.

Hereinafter, embodiments of the present invention will be explained in detail with reference to the accompanying drawings. An explanation will be provided in the following, as to the DC power source and the control method thereof according to the present invention. With reference to the figures from FIG. 2 to FIG. 4, a configuration example of the DC power source will be explained, and a control example of the DC power source will be explained with reference to the figures from FIG. 5 to FIG. 9. In addition, with reference to FIG. 11 and FIG. 12, usage examples of the DC power source will be explained.

Figure 2:
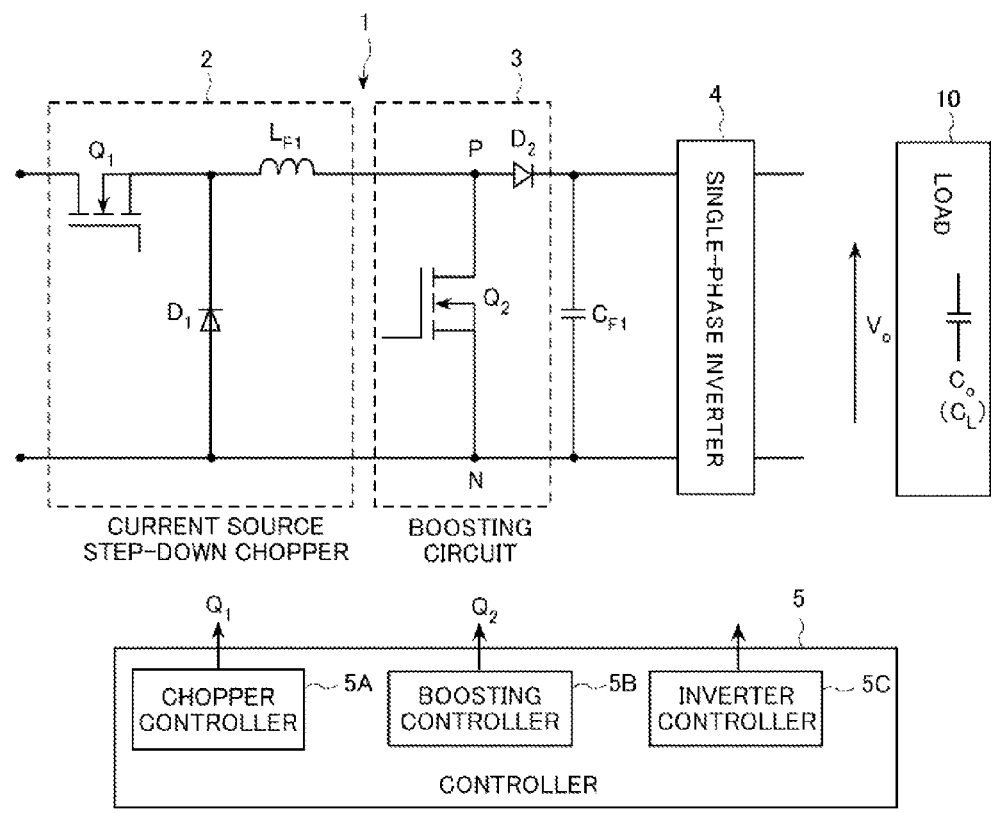
FIG. 2 illustrates an overall configuration of a DC power source according to the present invention.

With reference to FIG. 1 and FIG. 2, the configuration example of the DC power source according to the present invention will be explained. The DC power source 1 as shown in FIG. 2, is provided with a voltage source step-down chopper 2 forming a DC voltage source, a boosting circuit 3, and a bridge circuit made up of four switching elements from the first switching element to the fourth switching element, and further provided with a single-phase inverter 4 configured to convert the DC output from the voltage source step-down chopper 2 into single-phase AC power, and a controller 5 configured to control the voltage source step-down chopper 2, the boosting circuit 3, and the single-phase inverter 4.

Output from the boosting circuit 3 is supplied to the load 10. It is also possible to provide a rectifier (not illustrated in FIG. 2) between the boosting circuit 3 and the single-phase inverter 4, thereby establishing a configuration to apply AC-DC conversion to the output from the boosting circuit 3 and supply thus obtained DC voltage to the load 10.

By way of example, the DC source may be provided with the rectifier configured to rectify AC power from an AC source, and a snubber constituting a protection circuit which suppresses high voltage being generated transiently.

The voltage source step-down chopper 2 is provided with a switching element $Q_1$, a diode $D_1$, and a DC reactor $L_{F1}$. The switching element $Q_1$ applies chopper control to the DC voltage, thereby accomplishing step-down of voltage. The DC reactor $L_{F1}$ applies smoothing to the direct current that has been subjected to chopper control, and the chopper output capacitor $C_{F1}$ forms DC voltage.

The boosting circuit 3 may be established by connecting the switching element $Q_2$ between the positive terminal P and the negative terminal N, and connecting the diode $D_2$ between the switching $Q_2$ and the chopper output capacitor $C_{F1}$. The switching element $Q_2$ establishes a short circuit between the positive terminal P and the negative terminal N of the voltage source step-down chopper 2.

The diode $D_2$ is a blocking diode configured to prevent reversed flow from the single-phase inverter 4 and the chopper output capacitor $CF_1$ toward the voltage source step-down chopper 2, and it is not limited to the configuration as connected to the positive terminal P side, but it may be connected to the negative terminal N side.

The switching element $Q_2$ of the boosting circuit 3 is a switching element that controls the short-circuit between the positive terminal P and the negative terminal N. When the switching element $Q_2$ is turned on, a short-circuit is established between the positive terminal P and the negative terminal N, a closed circuit is formed together with the diode $D_1$ and the DC reactor $L_{F1}$ of the voltage source step-down chopper 2, and then the short-circuit $\Delta_i$ passes therethrough as shown in FIG. 1A. On the other hand, when the switching element $Q_2$ is switched from on-state to off-state, connection between the positive terminal P and the negative terminal N is blocked. The voltage source step-down chopper 2 is brought into conduction with the load 10, via the boosting circuit 3 and the single-inverter 4, and the short-circuit current $\Delta_i$ passes toward the load 10, along with the direct current from the voltage source step-down chopper 2.

The chopper output capacitor $C_{F1}$ performs boosting by accumulating the energy of the short-circuit current $\Delta_i$ passing through the DC reactor $L_{F1}$ of the voltage source step-down chopper 2. In addition, the chopper output capacitor absorbs surge voltage generated when commutation operation is performed between the switching elements of the single-phase inverter 4 and the energy of the reactor being series-connected with each of the switching elements, whereby an operation for protecting the switching elements is achieved.

It is to be noted that a value of the chopper output capacitor $C_{F1}$ is set in such a manner that current delay may not affect the commutation of the inverter operation, according to the capacitance on the load side and the time constant of the wiring inductance.

The single-phase inverter 4 inputs the output voltage from the boosting circuit 3 and performs DC-AC conversion by controlling the switching elements of the bridge circuit provided in the single-phase inverter 4.

The single-phase inverter 4 is provided with the switching elements from the first switching element to the fourth switching element in bridge connection. As the switching element, a solid-state switching element such as IGBT and MOSFET may be employed, for instance. Each switching element of the single-phase inverter circuit performs switching operation based on a control signal from the controller 5, and converts DC power to output AC power.

The rectifier rectifies the AC output from the single-phase inverter 4 and supplies DC output to the load. In order to remove the high-frequency ripple component included in the AC output from the single-phase inverter, a DC filter circuit may be provided at the output terminal of the rectifier. The DC filter circuit may be made up of the output capacitor (not illustrated) connected in parallel with the output terminal, and an output reactor (not illustrated) connected in series therewith.

The output from the boosting circuit 3, or the DC output from the rectifier provided between the boosting circuit 3 and the single-phase inverter 4 is outputted via the wiring inductance, and supplied to the plasma generator via an output cable which establishes connection between the direct current power source 1 and the plasma generator.

The DC power source 1 may use parasitic impedance, instead of the DC filter circuit connected to the rectifier, as a configuration to remove the high-frequency ripple component. By way of example, it is possible to use as an inductance component, the inductance of the wiring between the rectifier and the output terminal, and it is further possible to use the inductance and capacitor included in the output cable connected between the DC power source 1 and the load 10, or the electrode capacitance of the plasma generator in the case where the load corresponds to a plasma load. The aforementioned parasitic impedance of the single-phase inverter, and capacitive components of the output cable and of the electrode capacitance may substantially constitute the DC filter circuit, thereby reducing the high-frequency ripple component included in the AC output from the single-phase inverter.

In addition, when drive frequency of the single-phase inverter circuit is decreased, the ripple component of the DC voltage possesses a property to increase. Therefore, by increasing the drive frequency of the single-phase inverter circuit, it is possible to reduce the necessity of the output capacitor and the output reactor. Furthermore, increase of the drive frequency of the single-phase inverter circuit may suppress the energy which is held inside the DC power source 1.

The DC power source 1 of the present invention is provided with the controller 5. The controller 5 is further provided with the chopper controller 5A configured to control the voltage source step-down chopper 2, the boosting controller 5B configured to control the boosting circuit 3, and the inverter controller 5C configured to control the single-phase inverter 4. The controller 5 receives feedback signals from the output terminal of the direct current power source 1 or from the load side. The feedback signal may be voltage or current at the output terminal of the DC power source 1, for instance.

The chopper controller 5A forms a control signal that controls turning on and off the switching element $Q_1$ in the voltage source step-down chopper 2. The boosting controller 5B forms a control signal that controls turning on and off the switching element $Q_2$ provided between the positive terminal P and the negative terminal N. The inverter controller 5C forms a pulse control signal that controls turning on and off the switching elements of the single-phase inverter 4.

The chopper controller 5A is a constituent element configured to apply chopper control to the switching element $Q_1$ in the voltage source step-down chopper 2, and the chopper controller 5A detects chopper current being the output current from the switching element $Q_1$ and the output voltage from the DC power source 1, and controls the output from the voltage source step-down chopper 2 to become a predetermined current value and a predetermined voltage value, based on detection values of the chopper current and the output voltage. On the basis of an arc detection signal from an arc detector, it is switched to off-state when an arc is generated, and it is switched to on-state when the arc is extinguished.

The boosting controller 5B is a constituent element configured to perform a control operation to turn on and off the switching element $Q_2$ in the boosting circuit 3, and form a short-circuit pulse signal that establishes intermittent short-circuit according to the on-state of extremely short time, in the boosting operation of the ignition mode. Furthermore, in the short-circuit operation when an abnormal arc is generated, it is switched to the on-state at the time of arc generation, whereas it is switched from the on-state to the off-state when the arc is extinguished, on the basis of the arc detection signal of the arc detector (not illustrated).

According to the operations of the switching element $Q_1$ and the switching element $Q_2$, the circuit of the diode $D_1$ and the DC reactor $L_{F1}$ of the voltage source step-down chopper 2 is formed, and the energy accumulated in the DC reactor $L_{F1}$ is allowed to pass in the form of the short-circuit current $\Delta_i$.

The inverter controller 5C forms a pulse control signal to turn on and off the switching elements in the single-phase inverter 4, and controls the switching operation of each of the switching elements $Q_U$, $Q_V$, $Q_X$, and $Q_Y$ that constitute the bridge circuit of the single-phase inverter 4. The single-phase inverter 4 converts DC being inputted to AC, by controlling the switching elements.

Figure 3:
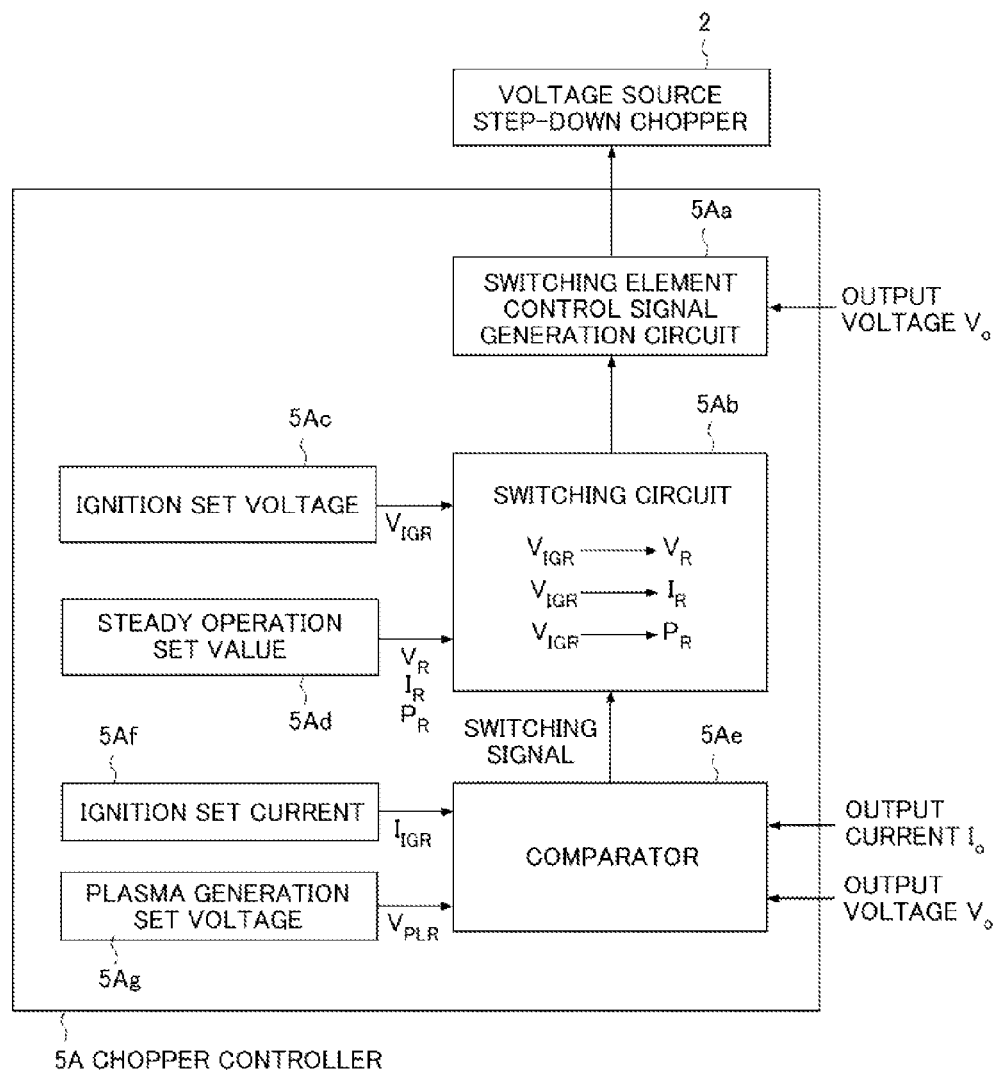
FIG. 3 illustrates a configuration example of a chopper controller provided in the DC power source according to the present invention.

Next, with reference to FIG. 3, one configuration example of the chopper controller 5A will be explained. The chopper controller 5A applies pulse width control to the switching element $Q_1$ in the voltage source step-down chopper 2, so as to perform constant voltage control in the ignition mode, or to perform any control selected from the constant voltage control, constant current control, and constant power control, in the steady operation mode. Such control is performed by switching between a set value of the ignition mode and a set value of the steady operation mode, the set values being different from each other. In the ignition mode, the set value corresponds to the ignition set voltage $V_{IGR}$, and in the steady operation mode, the set value corresponds to the steady operation set voltage $V_R$ in the constant voltage control, the set value corresponds to the steady operation set current $I_R$ in the constant current control, and the set value corresponds to the steady operation set power $P_R$ in the constant power control.

It is possible to perform switching from the ignition set voltage $V_{IGR}$ to any of the set values (the steady operation set voltage $V_R$ in the constant voltage control, the steady operation set current $I_R$ in the constant current control, the steady operation set power $P_R$ in the constant power control) in the respective control in the steady operation mode, when it is detected that the output voltage and the output current have reached predetermined values. For example, switching between the set values by detecting the output voltage and the output current is performed upon detecting the following time point; i.e., the output current increases in the ignition mode and reaches the ignition set current being set in association with a start of the plasma discharge, and the output voltage drops to the plasma generation voltage. FIG. 3 is a configuration that switches the ignition set voltage $V_{IGR}$ to any of the set values (the steady operation set voltage $V_R$, the steady operation set current $I_R$, or the steady operation set power $P_R$) of the selected control, based on the detection of the output voltage $V_o$ and the output current $I_o$.

The chopper controller 5A is provided with a comparator 5Ae as a configuration to switch the set values based on the comparison between the output current and the output voltage, and each of the set values. The output current $I_o$ is compared with the ignition set current $I_{IGR}$ and the output voltage $V_o$ is compared with the plasma generation set voltage $V_{PLR}$, and the comparator outputs a switching signal when the output current $I_o$ becomes equal to or higher than the ignition set current $I_{IGR}$, and the output voltage $V_o$ becomes equal to or lower than the plasma generation set voltage $V_{PLR}$. The ignition set current $I_{IGR}$ may be stored in the memory means 5Af, and the plasma generation set voltage $V_{PLR}$ may be stored in the memory means 5Ag.

Instead of the plasma generation set voltage $V_{PLR}$, the ignition set voltage $V_{IGR}$ and a constant k are stored, and the plasma generation set voltage $V_{PLR}$ may be set by multiplying the ignition set voltage $V_{IGR}$ by the constant k. It is further possible to set the constant k to any value, within the range from 0.2 to 0.9, for instance.

The chopper controller 5A is provided with a switching circuit 5Ab which performs switching of the set values for the control in the pulse width control on the switching element $Q_1$, from the ignition set voltage $V_{IGR}$ performing the constant voltage control in the ignition mode, to a set value of the control selected in the steady operation mode (the steady operation set voltage $V_R$ in the constant voltage control, the steady operation set current $I_R$ in the constant current control, and the steady operation set power $P_R$ in the constant voltage control).

The switching circuit 5Ab outputs any of the ignition set voltage $V_{IGR}$, the steady operation set voltage $V_R$, the steady operation set current $I_R$, and the steady operation set power $P_R$, according to the switching signal outputted from the comparator 5Ae. It is possible to store the ignition set voltage $V_{IGR}$ in the memory means 5Ac, and the steady operation set values such as the steady operation set voltage $V_R$, the steady operation set current $I_R$, and the steady operation set power $P_R$ may be stored in the memory means 5Ad. Each of the memory means 5Ac to 5Ag may not be limited to the configuration as provided within the chopper controller 5A. By way of example, they may be configured as provided in an optional constitutional element such as a controller for controlling the entire DC power source, or as an alternative configuration, it may be inputted from the outside of the DC power source.

The chopper controller 5A is provided with a switching element control signal generation circuit 5Aa configured to generate a switching element control signal to perform any of the control; the constant voltage control, the constant current control, and the constant power control, according to the pulse width control, so that the output becomes the set value. The switching element control signal generation circuit 5Aa generates the switching element control signal, assuming as the set value, any of the ignition set voltage $V_{IGR}$ the steady operation set voltage $V_R$, the steady operation set current $I_R$, the steady operation set power PR transferred from the switching circuit 5Ab, and applies chopper control to the switching element $Q_1$ in the voltage source step-down chopper 2.

Figure 4:
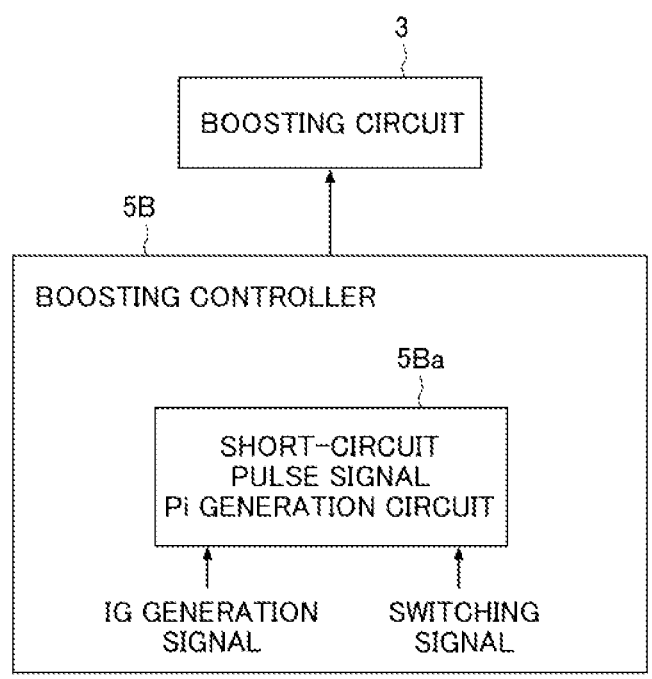
FIG. 4 illustrates a configuration example of a boosting controller provided in the DC power source according to the present invention.

Next, with reference to FIG. 4, one configuration example of the boosting controller 5B will be explained. The boosting controller 5B is provided with a short-circuit pulse signal generation circuit 5Ba configured to generate a short-circuit pulse signal $P_i$, and controls the intermittent short-circuit operation of the boosting circuit 3 according to the short-circuit pulse signal $P_i$. Generation of the short-circuit pulse signal $P_i$ starts when the ignition signal IG rises, and this generation is stopped by the switching signal being an output from the comparator 5Ae in the chopper controller 5A.

The inverter controller 5C controls the switching operation of the switching elements connected to the arms respectively, which constitute the bridge circuit of the single-phase inverter 4. The single-phase inverter 4 converts DC being inputted to AC, according to the control of the switching elements.

Figure 10:
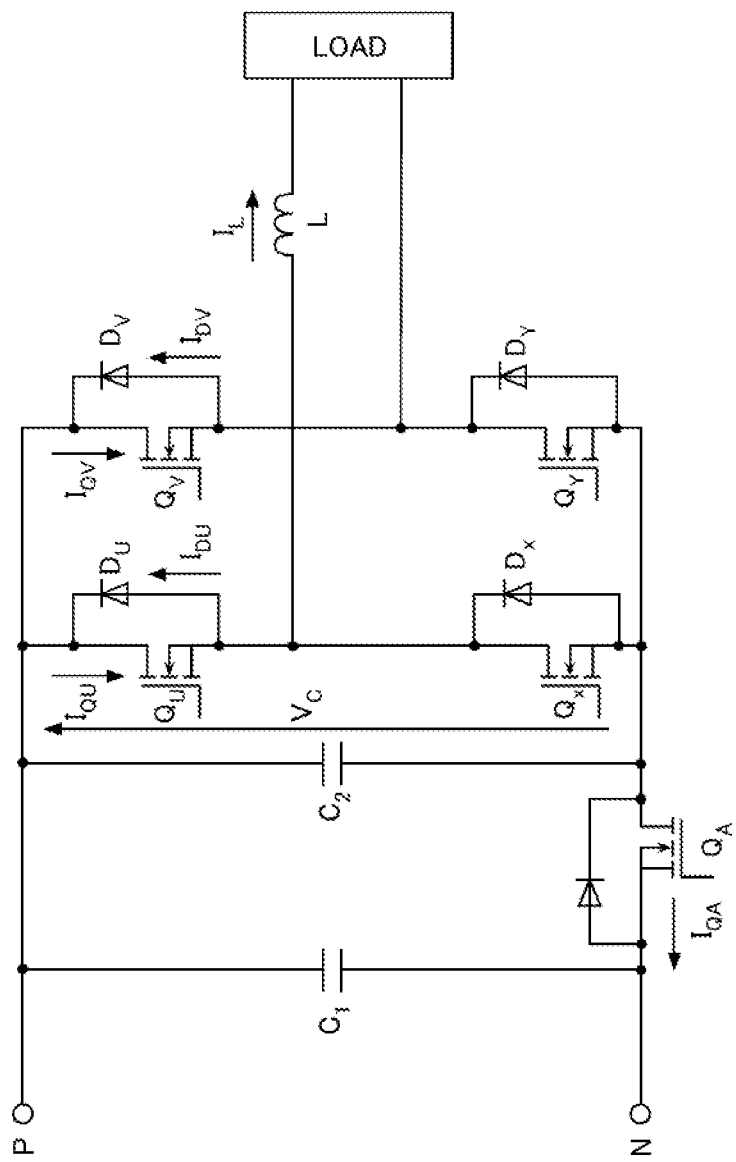
FIG. 10 illustrates a single-phase inverter of the DC power source.

As shown in FIG. 10, the single-phase inverter 4 is made up of the bridge circuit including four arms, for instance. The arms are respectively provided with four switching elements $Q_U$, $Q_V$, $Q_X$, and $Q_Y$. The switching element $Q_U$ and the switching element $Q_X$ are connected in series, and the switching element $Q_V$ and the switching element $Q_Y$ are connected in series.

The connection point between the switching element $Q_U$ and the switching element $Q_X$ is connected to the positive terminal side of the load via the reactor $L_{m1}$, and the connection point between the switching element $Q_V$ and the switching element $Q_Y$ is connected to the negative terminal side of the load.

The controller 5 receives a feedback signal from the output terminal or the load side of the DC power source 1. The feedback signal may have the same voltage as the voltage at the output terminal of the DC power source 1, for instance.

[Operation Example of the DC Power Source]

Next, operation examples of the ignition mode and the steady operation mode in the DC power source according to the present invention will be explained, with reference to FIG. 5 illustrating the boosting operation, the flowchart in FIG. 6, the timing charts in FIG. 7 and in FIG. 8, and the operation state diagram of the ignition mode and the steady operation mode in FIG. 9.

When the DC power source supplies DC power to the plasma generator and plasma treatment is performed in the plasma generator, plasma discharge is generated according to the ignition mode S1 upon power activation or upon restarting, and after the plasma discharge is generated, it is maintained according to the steady operation mode S2.

In the ignition mode, chopper control is performed in an IG (ignition) voltage rise interval and an IG voltage constant-voltage interval, within the voltage source step-down chopper.

Hereinafter, an explanation will be provided as to the case where the constant voltage control is selected as the steady operation mode, and the steady operation set voltage $V_R$ is set as the set value.

(Operation when Short-Circuit is Established)

Figure 5A:
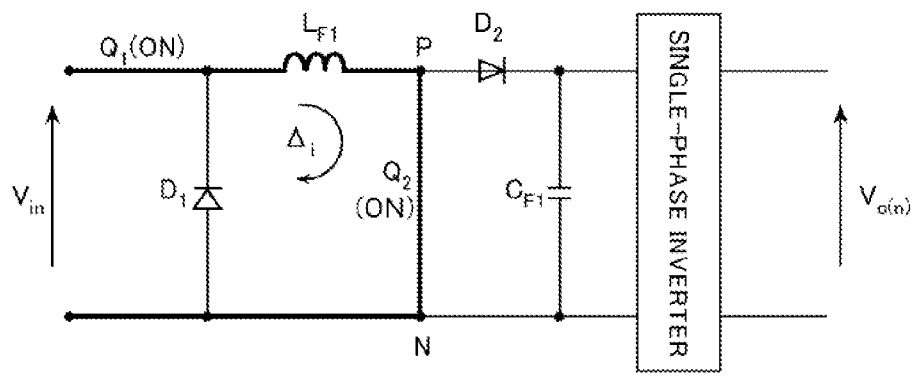
FIGS. 5A and B illustrate a circuit state at the time of ignition in the DC power source according to the present invention.
Figure 5B:
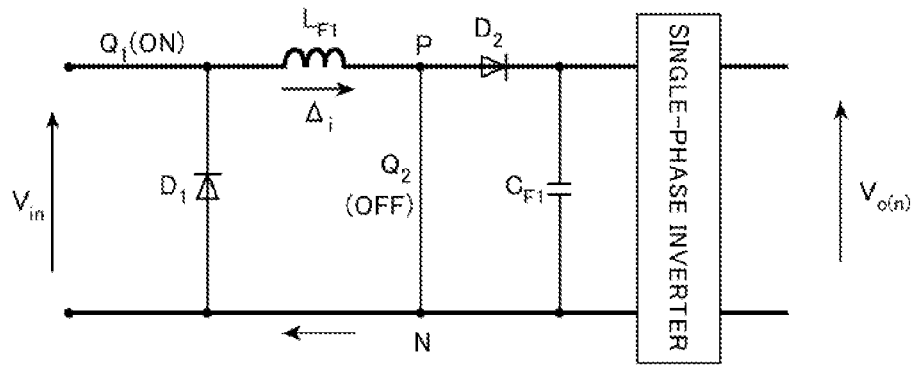

FIG. 5 illustrates the short-circuit operation of the boosting circuit in the DC power source according to the present invention. FIG. 5A illustrates the circuit state when a short-circuit is established, and FIG. 5B illustrates the circuit state at the end of the short-circuit duration.

At the time of power supply for supplying power from the DC power source to the single-phase inverter side, the switching element $Q_1$ is in the on-state, and the switching element $Q_2$ of the boosting circuit is in the off-state. Then, power is supplied to the single-phase inverter side from the DC power source via the voltage source step-down chopper. At this time, the single-phase inverter is supplied with voltage that has been boosted in the boosting circuit.

FIG. 5A illustrates the short-circuit state of the intermittent short-circuit operation. When the short-circuit is established, the on-state is kept on the switching element $Q_1$, and the switching element $Q_2$ of the boosting circuit is switched from the off-state to the on-state. Then, a circuit of the diode $D_1$ and the DC reactor $L_{F1}$ of the voltage source step-down chopper 2 is formed. Short-circuit current $\Delta_i$ passes through the DC reactor $L_{F1}$, and this accumulates energy.

FIG. 5B illustrates the state when the short-circuit duration is ended in the intermittent short-circuit operation. At the end of the short-circuit duration, the on-state is kept on the switching element $Q_1$, and the switching element $Q_2$ in the boosting circuit is switched from the on-state to the off-state. Then, the short-circuit current $\Delta_i$ is made to flow to the load side, and power supply is restarted from the DC power source to the single-phase inverter side via the voltage source step-down chopper and the boosting circuit.

At this time, the short-circuit current $\Delta_i$ increases the voltage of the output capacitance $C_{OT}$. It is to be noted that the output capacitance $C_{OT}$ is represented by the chopper output capacitor $C_{F1}$ of the voltage source step-down chopper. Alternatively, when the load has the load capacitance $C_L$, it is represented by the parallel capacitance of the chopper output capacitor $C_{F1}$ and the load capacitance $C_L$.

(Operation when Arc is Generated)

The boosting circuit performs the intermittent short-circuit operation in the ignition mode. In addition, for the case of suspending and restoring the DC output from the DC power source, when the DC output is suspended, the boosting circuit separates the chopper from the single-phase inverter so as to control excessive current to the load upon generation of an arc and extinguish the arc rapidly, thereby maintaining the current passing through the chopper as circulating current. Thereafter, the circulating current being held is supplied to the load at the time of restarting the inverter, and it is possible to perform operation to reduce delay in supplying DC power to the load, when the DC output from the DC power source is restored.

When the arc is generated, the switching element $Q_1$ is switched from the on-state to the off-state, and the switching element $Q_2$ is switched from the off-state to the on-state. Then, the circulating circuit being a closed circuit of the diode $D_1$ and DC reactor $L_{F1}$ is formed in the voltage source step-down chopper, and circulating current $\Delta_{ic}$ is made to flow in the circulating circuit.

In the state where the circulating current is maintained, the off-state is kept on the switching element $Q_1$ and the on-state is kept on the switching element $Q_2$. Then, the power directed to the load is suspended, waiting the arc to extinguish. Meanwhile, the circulating current $\Delta_{ic}$ is made to pass through the circulating circuit and held therein.

When the art is extinguished, the switching element $Q_1$ is switched from the off-state to the on-state, and the switching element $Q_2$ in the boosting circuit is switched from the on-state to the off-state. Then, the circulating current $\Delta_{ic}$ passing through the circulating circuit is made to flow to the load side, and simultaneously, power supply is restored from the DC power source to the single-phase inverter side via the voltage source step-down chopper and the boosting circuit.

Figure 7:
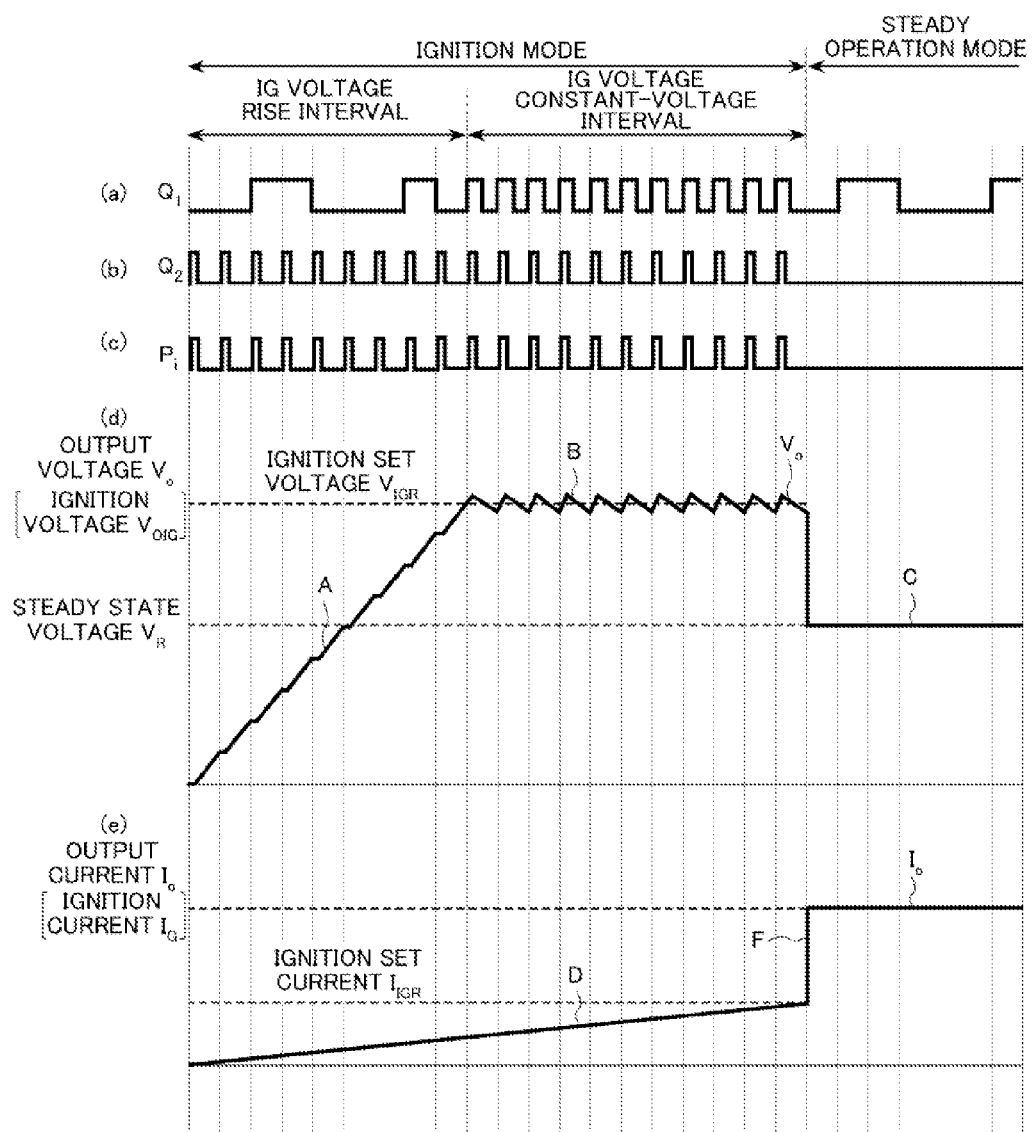
FIG. 7 is a timing chart for explaining the operation example of the ignition mode and the steady operation mode of the DC power source according to the present invention.
Figure 8:
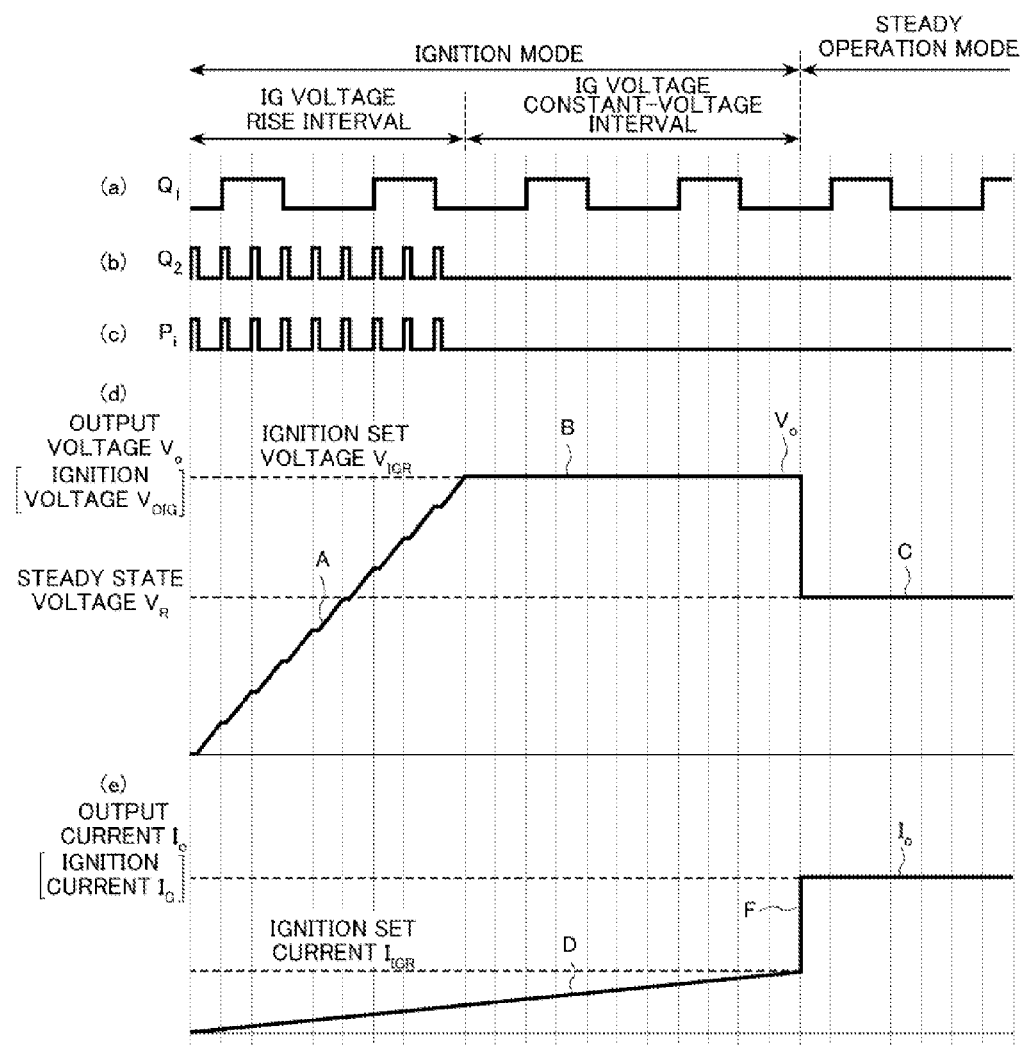
FIG. 8 is a timing chart for explaining the operation example of the ignition mode and the steady operation mode of the DC power source according to the present invention.

Hereinafter, with reference to the flow chart in FIG. 6, and the timing charts as shown in FIG. 7 and FIG. 8, an explanation will be provided as to the operation example that the boosting circuit establishes a short-circuit between the positive voltage side and the negative voltage side, and this short-circuit operation passes the short-circuit current. FIG. 7 and FIG. 8 illustrate two operation modes held by the ignition voltage in the IG voltage constant-voltage interval.

[Ignition Mode S1]

Firstly, the ignition mode S1 will be explained. The chopper controller performs the control operation in the ignition mode, according to two intervals; the control during the IG voltage rise interval (S1a to S1c) in which the output voltage is boosted to the ignition set voltage, and the control during the IG voltage constant-voltage interval (S1d to S1f) in which the boosted output voltage is maintained at the ignition set voltage. On the other hand, the boosting controller performs the boosting control during the ignition mode S1, and allows the boosting circuit to perform the intermittent short-circuit operation, according to the short-circuit pulse signal $P_i$.

In FIG. 7 and FIG. 8, the operation state of the switching element $Q_1$ of the voltage source step-down chopper is indicated by A, the operation state of the switching element $Q_2$ of the boosting circuit is indicated by B, the operation state of the short-circuit pulse signal $P_i$ is indicated by C, the output voltage $V_o$ is indicated by D, and the output current $I_o$ is indicated by E.

(IG Voltage Rise Interval, Boosting Control)

In the IG voltage rise interval, boosting the output voltage up to the ignition set voltage is controlled.

The boosting controller starts up an IG (ignition) generation signal (not illustrated in FIG. 7 and FIG. 8) that defines the intervals of the ignition mode (S1A). Along with the rise of the IG (ignition) generation signal, the short-circuit pulse signal $P_i$ is generated (S1B).

The short-circuit pulse signal $P_i$ generated in the step S1B turns on the switching element $Q_2$ between the positive voltage side and the negative voltage side of the boosting circuit, and establishes a short-circuit (S1C).

The short-circuit pulse signal $P_i$ is generated only for an extremely short time $T_{ion}$, which turns the switching element $Q_2$ to the on-state, thereby establishing the short-circuit between the positive voltage side and the negative voltage side. The short-circuit pulse signal $P_i$ in the IG voltage rise interval as shown in FIG. 7C and FIG. 8C, and the switching element $Q_2$ in the IG voltage rise interval as shown in FIG. 7B and FIG. 8B indicate the operation state for the case above.

On the other hand, the chopper controller sets the ignition set voltage $V_{IGR}$ as the voltage set value for applying constant voltage control to the output voltage $V_o$, along with the rise of the IG (ignition) generation signal (ignition not illustrated) (S1a).

The output voltage $V_o$ and the output current $I_o$ are indicated by D and E in FIG. 7 and FIG. 8. With respect to the output voltage $V_o$, the ignition set voltage $V_{IGR}$ represents the voltage set value of the output voltage $V_o$ in the constant voltage control of the ignition mode, and the steady operation set voltage $V_R$ represents the voltage set value of the output voltage $V_o$ in the constant voltage control of the steady operation. In addition, with respect to the output current $I_o$, the ignition set current $I_{IGR}$ represents the current set value of the output current $I_o$ in the ignition mode.

In FIG. 7 and FIG. 8, the output voltage $V_o$ is represented as the ignition voltage $V_{OIG}$ and the output current $I_o$ is represented as the ignition current $I_G$, within the IG voltage rise interval and the IG voltage constant-voltage interval in the ignition mode.

The step of the short-circuit operation of S1C allows the short-circuit current $\Delta_i$ to pass through the voltage source step-down chopper. This short-circuit current $\Delta_i$ is accumulated in the reactor provided in the voltage source step-down chopper (S1b).

A fall of the short-circuit pulse signal $P_i$ stops the short-circuit operation, and the energy accumulated in the reactor boosts the output voltage $V_o$ (S1D).

The output voltage $V_o$ (ignition voltage $V_{OIG}$) is compared with the ignition set voltage $V_{IGR}$, and if the output voltage $V_o$ has not reached the ignition set voltage $V_{IGR}$, the processes (S1C to S1D) are performed; i.e., the next short-circuit pulse signal $P_i$ establishes a short-circuit between the positive voltage side and the negative voltage side of the boosting inverter, so as to boost the output voltage $V_o$ according to the short-circuit current $\Delta_i$. Then, the boosting step according to the short-circuit operations S1C to S1D is repeated until the output voltage $V_o$ (Ignition voltage $V_{OIG}$) reaches the ignition set voltage $V_{IGR}$.

The output voltage $V_o$ (ignition voltage $V_{OIG}$) is boosted by stages, according to the repetition of the intermittent short-circuit operation of the steps S1C and S1D. With regard to the output voltage $V_o$ (ignition voltage $V_{OIG}$) as indicated by D in FIG. 7 and FIG. 8, a portion indicated by the symbol A represents the step-by-step boosting state in which the output voltage $V_o$ (Ignition voltage $V_{OIG}$) rises toward the ignition set voltage $V_{IGR}$.

(Boosting Operation)

Hereinafter, the boosting operation according to the short-circuit current will be explained.

As shown in FIG. 5, the short circuit of the boosting circuit allows the short-circuit current $\Delta_i$ to pass through the voltage source step-down chopper. The short-circuit current $\Delta_i$ passes only for an extremely short time $T_{ion(n)}$ corresponding to the signal width of the short-circuit pulse signal $P_i$. The short-circuit current $\Delta_i$ is reset for each short-circuit operation.

Energy $J_{i(n)}$ according to the short-circuit current $\Delta_i$ is accumulated in the DC reactor $L_{F1}$ of the voltage source step-down chopper. When the input voltage to the DC reactor $L_{F1}$ is assumed as $V_{in}$, the short-circuit current $\Delta_{i1}$ for one time of the extremely short time $T_{ion(n)}$, and the energy $J_{i(n)}$ according to the short-circuit current $\Delta_{i1}$ are expressed by the following formulas:

$$\Delta_{i1} = (V_{in}/L_{F1}) \times T_{ion(n)} \tag{1}$$

$$J_{i(n)} = (1/2) \times L_{F1} \times \Delta_{i1}^2 \tag{2}$$

The energy $J_{i(n)}$ accumulated in the DC reactor $L_{F1}$ according to the short-circuit operation of $T_{ion(n)}$, during the period from the end of the n-th short-circuit operation $T_{ion(n)}$ to the start of the next (n+1)th short-circuit operation $T_{ion(n+1)}$, is supplied to the load, via the inverter, the transformer, and the rectifier.

Here, when a capacitive component on the output side of the DC power source is assumed as output capacitance Co, and the output voltage upon ignition is assumed as $V_{o(n)}$, the energy $J_{i(n)}$ transferred to the output capacitance $C_{OT}$ according to the short-circuit operation is expressed by the following formula (3). Here, it is possible to assume the output capacitance $C_{OT}$ as the chopper output capacitance $C_{F1}$ and the load capacitance $C_L$ of the electrode capacitance of the plasma generator being the load:

$$\begin{aligned}J_{i(n)} &= (1/2) \times L_{F1} \times \Delta_{i1}^2 \\ &= (1/2) \times C_{OT} \times (V_{o(n)}^2 - V_{o(n-1)}^2)\end{aligned} \tag{3}$$

It is to be noted here that the output voltage before performing the initial short-circuit operation is assumed as $V_{o(0)}=0$.

According to the formula (3), the output voltage $V_{o(n)}$, at the time of ignition is expressed by the following formula (4):

$$V_{o(n)} = \{(L_{F1}/C_{OT}) \times \Delta_{i1}^2 + V_{o(n-1)}^2\}^{1/2} \tag{4}$$

The formula (4) represents the output voltage $V_{o(n)}$ when the short-circuit operation is repeated for n times.

When the short-circuit operation is performed three times (n=3), the output voltage upon each short-circuit operation is expressed by the following formulas:

$$V_{o(1)} = \{(L_{F1}/C_{OT}) \times \Delta_{i1}^2\}^{1/2} \tag{5}$$

$$V_{o(2)} = \{(L_{F1}/C_{OT}) \times \Delta_{i1}^2 + V_{o(1)}^2\}^{1/2} \tag{6}$$

$$V_{o(3)} = \{(L_{F1}/C_{OT}) \times \Delta_{i1}^2 + V_{o(2)}^2\}^{1/2} \tag{7}$$

The formula (4) indicates that the output voltage $V_{o(n)}$ at the time of ignition is able to be selectively determined, according to the number of the short-circuit operations n.

In addition, the short-circuit current $\Delta_{i1}$ is proportional to the input voltage $V_{in}$ as indicated by the formula (1). The input voltage $V_{in}$ corresponds to the output voltage from the voltage source step-down chopper, and the output voltage is determined by the on-duty cycle of the switching element $Q_1$ of the voltage source step-down chopper.

Therefore, the boosting ratio of the output voltage $V_{o(n)}$ may be determined by the number of the short-circuit operations n, and the on-duty cycle of the switching element $Q_1$ in the voltage source step-down chopper.

It is to be noted that the short-circuit operation is performed n times during the ignition mode. Therefore, in the case where the short-circuit pulse signal is outputted in sync with the gate pulse signal, the number of times above is automatically determined by the time period from the point of starting the ignition mode to the point of canceling the ignition mode, and the duration of the gate pulse signal.

(Control in the IG Voltage Constant-Voltage Interval)

In the IG voltage constant-voltage interval, the boosted output voltage (ignition voltage) is controlled to be maintained at the ignition set voltage.

When the output voltage $V_o$ (ignition voltage $V_{OIG}$) reaches the ignition set voltage $V_{IGR}$ (S1c), the control is switched from the control in the IG voltage rise interval (S1a to S1c) to the control in the IG voltage constant-voltage interval (S1d to S1f), and the boosted output voltage $V_o$ (ignition voltage $V_{OIG}$) is maintained at the ignition set voltage $V_{IGR}$, in the ignition mode of the chopper control. With regard to the output voltage $V_o$ (ignition voltage $V_{OIG}$) as indicated by E in FIG. 7 and FIG. 8, a portion indicated by symbol B represents the constant voltage state being maintained at the ignition set voltage $V_{IGR}$.

There are two modes for maintaining the ignition set voltage $V_{IGR}$. FIG. 7 illustrates the first mode, and FIG. 8 illustrates the second mode.

(First Mode)

In the first mode, the ignition set voltage $V_{IGR}$ is maintained by applying constant voltage control to the ignition voltage, according to the chopper control by the voltage source step-down chopper.

In the control during the IG voltage constant-voltage interval, the chopper control of the voltage source step-down chopper is switched from the pulse width control in the IG voltage rise interval to the constant voltage control, and the voltage is maintained in such a manner that the output voltage $V_o$(ignition voltage $V_{OIG}$) becomes the ignition set voltage $V_{IGR}$ (S1d). The switching element $Q_1$ of the voltage source step-down chopper is subjected to the constant voltage control as shown in FIG. 7A. In this constant voltage control, after the ignition voltage $V_{OIG}$ reaches the ignition set voltage $V_{IGR}$, the switch is turned off, and when the ignition voltage $V_{OIG}$ goes down from the ignition set voltage $V_{IGR}$, being a target value, the voltage is raised to the ignition set voltage $V_{IGR}$ according to the constant voltage control, thereby maintaining the voltage.

At this timing, in the control during the IG voltage constant-voltage interval, the boosting circuit is allowed to continue the intermittent short-circuit operation of the switching element $Q_2$ as shown in FIG. 7B. This is because, even when a short-circuit is established between the upper and lower terminals of the boosting circuit according to the intermittent short-circuit operation of the switching element $Q_2$, it is possible to maintain the output voltage $V_o$ (ignition voltage $V_{OIG}$) at the ignition set voltage $V_{IGR}$ according to the constant voltage control by the voltage source step-down chopper.

(Second Mode)

In the second mode, the switching element $Q_2$ of the boosting circuit is turned off (FIG. 8B) to stop the boosting operation, thereby maintaining the output voltage $V_o$ (ignition voltage $V_{IGR}$) at the ignition set voltage $V_{IGR}$.

According to the first mode or the second mode, the output voltage $V_o$(ignition voltage $V_{OIG}$) is maintained at the ignition set voltage $V_{IGR}$. It is to be noted that flowchart in FIG. 6 illustrates the first mode (S1d).

The output current $I_o$ is raised during both the IG voltage rise interval and the IG voltage constant-voltage interval. With regard to the output current $I_o$ (ignition current $I_G$) as shown in FIG. 7E and FIG. 8E, the portion indicated by the symbol D represents the current rising state during the IG voltage rise interval and during the IG voltage constant-voltage interval.

When plasma discharge is generated in the plasma generator, the ignition set current $I_{IGR}$ passes as the output current $I_o$ (ignition current $I_G$) and after shifting to the steady operation state, the output current $I_o$ under steady operation is made to flow. With regard to the output current $I_o$ (ignition current $I_G$) as shown in FIG. 7E, the output current $I_o$ (ignition current $I_G$) higher than the ignition set current $I_{IGR}$ passes at the portion indicated by the symbol E, which represents a shifting to the output current $I_o$ under the steady operation, and the portion indicated by the symbol F represents the output current $I_o$ under the steady operation.

Therefore, when the output voltage $V_o$ reaches the steady operation set voltage $V_R$, and the ignition set current $I_{IGR}$ passes as the output current $I_o$, it is determined that the plasma discharge has been generated.

If it is determined whether or not the plasma discharge has been generated in the plasma generator, by checking whether the output voltage $V_o$ and the output current $I_o$ reach the predetermined voltage and the predetermined current, respectively, the output current which passes is predetermined as the ignition set current IG and the output voltage is predetermined as the ignition set voltage $V_{IGR}$ when the plasma discharge is generated. Then, the output current $I_o$ and the ignition set current $I_{IGR}$ being predetermined are compared, and the output voltage $V_o$ is compared with the plasma generation set voltage $V_{PLR}$ which is obtained by multiplying the ignition set voltage $V_{IGR}$ being predetermined, by the constant k. The constant k is set to be a value in the range from 0.2 to 0.9, for instance (S1e, S1f).

When the output current $I_o$ (ignition current $I_G$) reaches the ignition set current $I_{IGR}$ (S1e), and the output voltage $V_o$ (ignition voltage $V_{OIG}$) drops lower than the plasma generation set voltage $V_{PLR}$ obtained by multiplying the ignition set voltage $V_{IGR}$ by the constant k (S1f), the chopper controller changes the set value of the output voltage $V_o$ of the constant voltage control from the ignition set voltage $V_{IGR}$ to the steady operation set voltage $V_R$ (S1g), and the inverter controller allows the IG (ignition) generation signal to fall (S1E) and stops generation of the short-circuit pulse signal $P_i$ (S1F).

The chopper controller switches the set voltage of the constant voltage control from the ignition set voltage $V_{IGR}$ to the steady operation set voltage $V_R$, and simultaneously, the inverter controller stops the IG generation signal so as to stop generation of the short-circuit pulse signal $P_i$, thereby terminating the ignition mode and it is switched to the steady operation mode. With regard to the output voltage $V_o$ as shown in FIG. 7D and FIG. 8D, the portion indicated by the symbol C represents the constant voltage state which is maintained at the steady operation set voltage $V_R$.

The IG voltage constant-voltage interval is terminated by stopping the short-circuit pulse signal $P_i$.

[Steady Operation Mode S2]

Next, in the steady operation mode S2, the plasma discharge generated in the ignition mode is maintained. In order to maintain the plasma discharge, the chopper controller performs the constant voltage control at the steady operation set voltage $V_R$, and the inverter controller performs normal pulse width control.

FIG. 9 illustrates operating conditions of the chopper control and the inverter control in the ignition mode and in the steady operation mode.

In the ignition mode, according to the first mode, the voltage source step-down chopper performs the pulse width control during the IG voltage rise interval, and the boosting circuit intermittently drives the switching element $Q_2$, thereby raise the output voltage $V_o$ (ignition voltage $V_{OIG}$) up to the ignition set voltage $V_{IGR}$. During the IG voltage constant-voltage interval, the voltage source step-down chopper performs constant voltage control to maintain the output voltage $V_o$ (ignition voltage $V_{OIG}$) at the ignition set voltage $V_{IGR}$.

At this time, the boosting circuit may continue the intermittent drive of the switching element $Q_2$, or stop the intermittent drive.

In the second mode, the voltage source step-down chopper performs the pulse width control during the IG voltage rise interval, and the boosting circuit intermittently drives the switching element $Q_2$, thereby raising the output voltage $V_o$ (ignition voltage $V_{OIG}$) to the ignition set voltage $V_{IGR}$.

After the output voltage $V_o$ (ignition voltage $V_{OIG}$) reaches the ignition set voltage $V_{IGR}$, the switching element $Q_2$ of the boosting circuit is turned off, and the ignition set voltage $V_{IGR}$ is maintained during the constant voltage interval.

In addition, in the ignition mode, the output current rises toward the ignition set current $I_{IGR}$. In the ignition mode, the inverter control performs DC-AC conversion control.

The point of time when the output current reaches the ignition set current $I_{IGR}$ and the output voltage drops down to the value ($k \cdot V_{IGR}$) obtained by multiplying the ignition set voltage $V_{IGR}$ by the constant k (k=0.2 to 0.9), is determined as the state where the plasma discharge is generated (plasma ignition), and it is switched from the ignition mode to the steady operation mode. Upon this switching from the ignition mode to the steady operation mode, the set voltage of the constant voltage control in the chopper control is switched from the ignition set voltage $V_{IGR}$ to the steady operation set voltage $V_R$.

In the steady operation mode, if any of the constant voltage control, the constant current control, and the constant power control is selected, the control is switched to the selected control after it is determined that the plasma discharge has been generated. On this occasion, after reaching the ignition set current $I_{IGR}$, the output current becomes the output current $I_o$ for the steady operation.

In the steady operation mode, any of the constant voltage control, the constant current control, and the constant power control is selected optionally as required, and it is selected in advance to be set in the switching circuit of the chopper controller, or it may be set from the outside of the DC power source. In addition, the selection may be configured as changeable.

[Usage Example of the DC Power Source]

Figure 11:
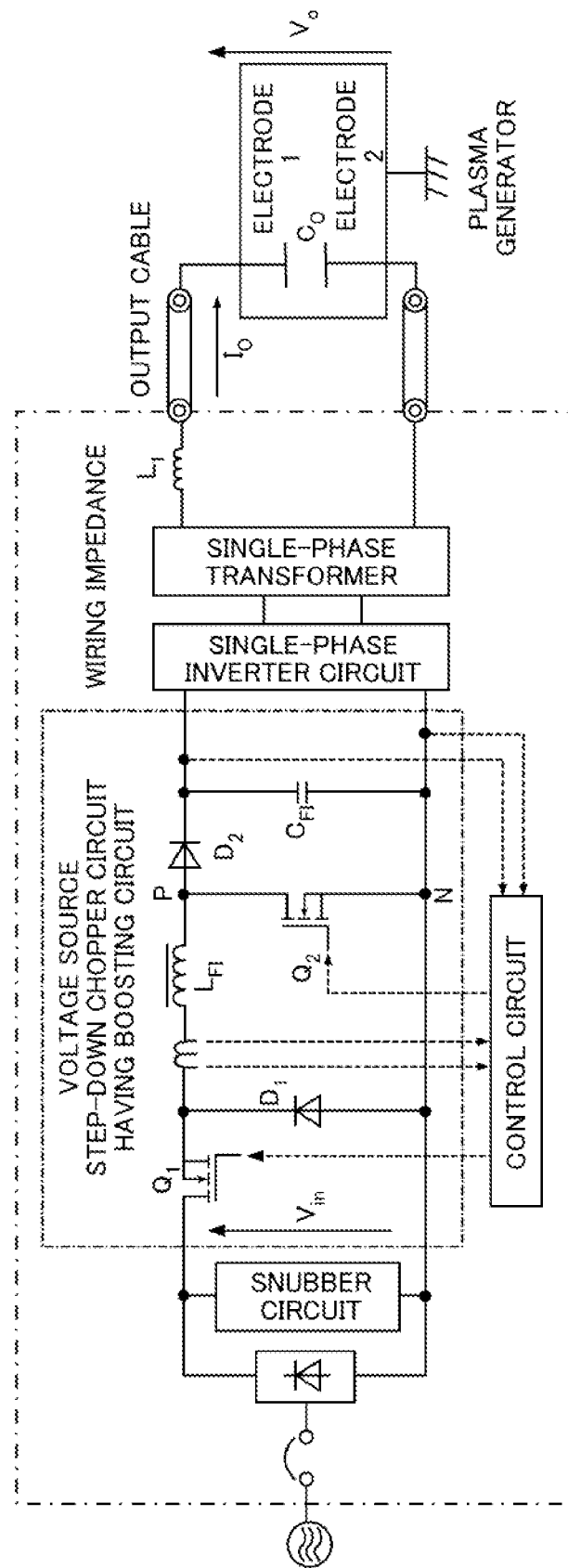
FIG. 11 illustrates a usage example of a dial-cathode power unit.
Figure 12:
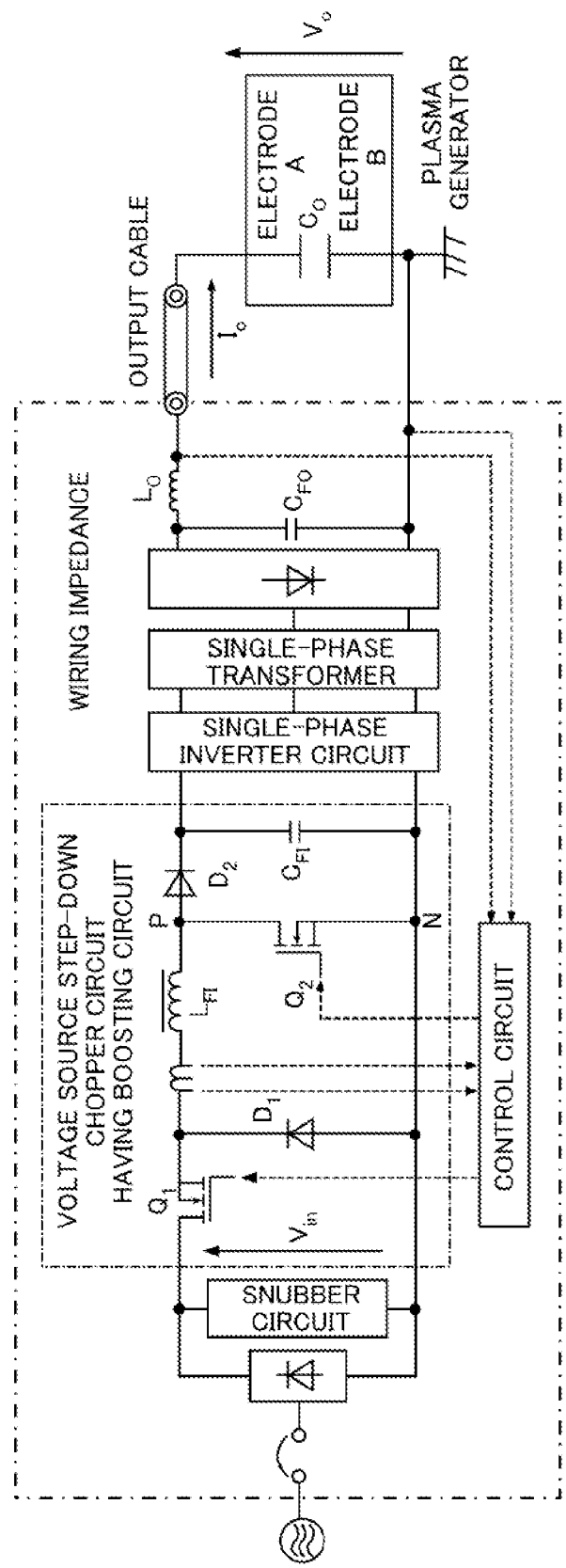
FIG. 12 illustrates a usage example of the DC power source.
Figure 13A:
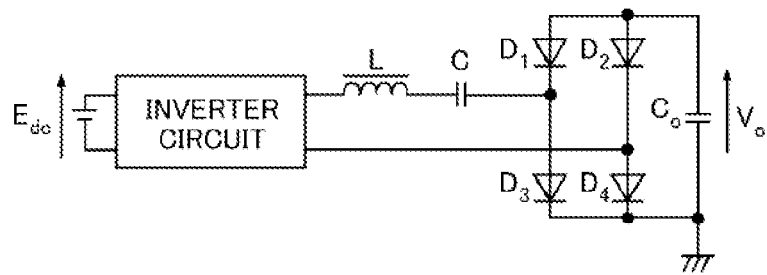
FIGS. 13A, 13B and 13C illustrate conventional circuit examples to generate ignition voltage for generating a plasma discharge.
Figure 13B:
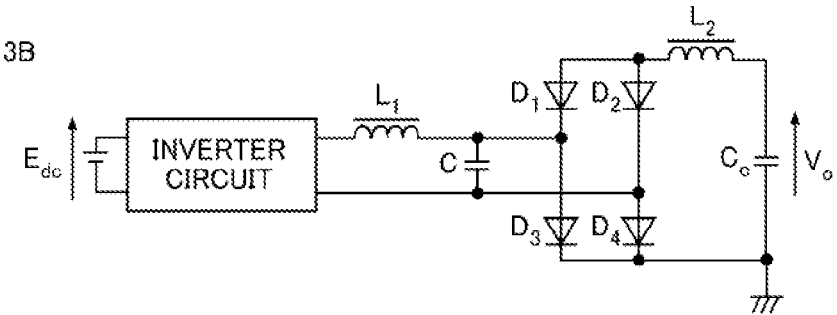
Figure 13C:
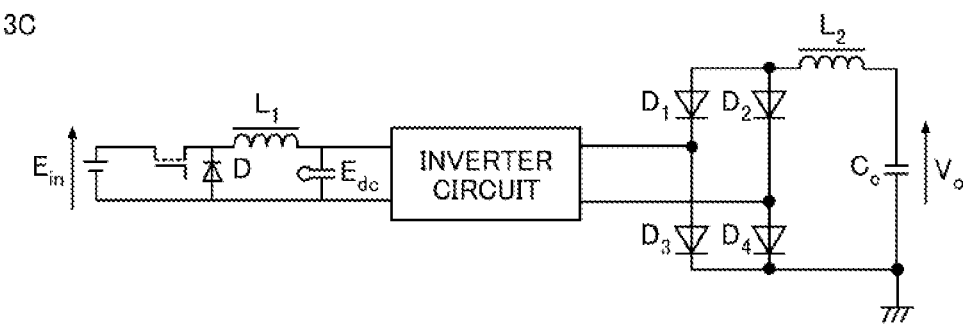

With reference to FIG. 11 and FIG. 12, the usage example of the DC power source will be explained.

(Configuration Example of a Dual-Cathode Power Supply Device)

FIG. 11 illustrates a usage example of the dual-cathode power supply device to which the DC power source according to the present invention is applied.

The dual-cathode power supply device is a power source that supplies high-frequency power to a load of a plasma generator, and the plasma generator is provided with two electrodes; the electrode 1 and the electrode 2 within a case connected to ground. This dual cathode power supply device allows AC voltage, being electrically symmetric, to be applied to the two electrodes.

The dual cathode power supply device is provided with a rectifier configured to rectify AC power from an AC power source, a snubber that forms a protection circuit configured to suppress high voltage generated transiently, a voltage source step-down chopper configured to convert DC power voltage being inputted, to predetermined voltage and output the DC voltage, a single-phase inverter configured to convert the DC output from the voltage source step-down chopper to a single phase AC output, and a single-phase transformer configured to convert the AC output from the single-phase inverter to predetermined voltage.

The dual-cathode power supply device supplies one output from the single-phase transformer to the electrode 1 via an output cable, and supplies the other output to the other electrode 2 via the output cable.

FIG. 12 illustrates a usage example that the DC power source of the present invention is applied to the load whose one end is connected to ground.

The DC power source is a power source that supplies high-frequency power to the load of the plasma generator, and the plasma generator is provided with two electrodes, one electrode is configured to input DC voltage from the DC power source, and the other electrode is connected to ground. According to this DC power source, one electrode is connected to ground, and DC voltage is able to be applied to the other electrode.

The DC power source is provided with a rectifier configured to rectify AC power from an AC power source, a snubber that forms a protection circuit configured to suppress high voltage generated transiently, a voltage source step-down chopper configured to convert DC power voltage being inputted from the rectifier, to predetermined voltage and output the DC voltage, a single-phase inverter configured to convert the DC output from the voltage source step-down chopper to a single-phase AC output, a single-phase transformer configured to convert the AC output from the single-phase inverter to predetermined voltage, and a rectifier configured to rectify the AC output in the single-phase transformer. The DC power source supplies the output from the rectifier to the electrode A via the output cable. The electrode B is a grounded electrode.

It is to be noted that the preferred embodiments and modifications described above are just examples of the DC power source and the control method of the DC power source relating to the present invention. It should be understood that the present invention is not limited to those embodiments but susceptible of changes and modifications without departing from the purpose of the invention, and all such modifications are intended to be included within the scope of the invention.

The DC power source of the present invention is applicable as a power source for supplying power to a plasma generator, in order to perform film-forming process or etching process.

EXPLANATION OF REFERENCES

1 DC power source
2 Voltage source step-down chopper
3 Boosting circuit
4 Single-phase inverter
5 Controller
5A Chopper controller
5Aa Switching element control signal generation circuit
5Ab Circuit
5Ac Memory means
5Ad Memory means
5Ae Comparison circuit
5Af Memory means
5Ag Memory means
5B Boosting controller
5Ba Short-circuit pulse signal generation circuit
5C Inverter controller
10 Load
$C_{F1}$ Chopper output capacitor
$C_L$ Load capacitance
$C_{OT}$ Output capacitance
$D_1$ Diode
$D_2$ Diode
$E_{dc}$ Input DC voltage
$E_{in}$ Input DC voltage
F Symbol
IG Ignition signal
$I_G$ Ignition current
$I_{IGR}$ Ignition set current
$I_o$ Output current
$I_R$ Steady operation set current
$J_i$ Energy
$L_{F1}$ DC reactor
$L_m1$ Reactor
N Negative terminal
P Positive terminal
$P_i$ Short-circuit pulse signal
$P_R$ Steady operation set power
$Q_1$ Switching element
$Q_2$ Switching element
$Q_U, Q_V, Q_X, Q_Y$ Switching elements
$T_{ion}$ Extremely short time
$V_{IGR}$ Ignition set voltage
$V_{in}$ Input voltage
$V_o$ Output voltage
$V_{OIG}$ Ignition set voltage
$V_{PLR}$ Plasma generation set voltage
$V_R$ Steady operation set voltage
$\Delta_i$ Short-circuit current
$\Delta_{i1}$ Short-circuit current
$\Delta_{ic}$ Circulating current

What is claimed is:

1. A DC power source configured to supply DC power to a plasma generator, comprising,
   a voltage source step-down chopper constituting a DC source,
   a boosting circuit configured to boost DC voltage of the voltage source step-down chopper,
   a single-phase inverter configured to convert a DC output from the boosting circuit to a single-phase AC, and
   a controller including a chopper controller configured to control the voltage source step-down chopper and a boosting controller configured to control the boosting circuit,
   the controller performing a switching control by switching between an ignition mode to supply ignition voltage that generates a plasma discharge in the plasma generator, and a steady operation mode to continue the plasma discharge in the plasma generator, and
   in the ignition mode,
   the boosting controller controlling output voltage that is applied to the plasma generator, by intermittently establishing a short-circuit between a positive voltage side and a negative voltage side of the boosting circuit and controlling a boosting operation according to a short-circuit current formed by the short-circuit.

2. The DC power source according to claim 1, wherein,
   the boosting controller generates a short-circuit pulse signal that intermittently short circuits a switching element connecting a positive voltage terminal and a negative voltage terminal of the boosting circuit, causing the short-circuit pulse signal to turn the switching element on, thereby establishing the short-circuit between the positive voltage terminal and the negative voltage terminal of an output terminal of the voltage source step-down chopper.

3. The DC power source according to claim 1, wherein,
   the controller performs in the ignition mode, boosting control and constant voltage control by switching therebetween, and the boosting controller performs the boosting control that repeats boosting more than once according to the short-circuit current, so as to raise the output voltage up to an ignition set voltage, and the chopper controller performs the constant voltage control that maintains the output voltage at the ignition set voltage, and
   the boosting control is switched to the constant voltage control, after the output voltage reaches the ignition set voltage.

4. The DC power source according to claim 3, wherein,
   the controller uses as parameters, an on-duty cycle of the chopper control by the chopper controller, and the number of intermittent short-circuit operations in the boosting controller,
   an input voltage of the voltage source step-down chopper is controlled by the on-duty cycle,
   a boosting ratio is controlled by the number of intermittent short-circuit operations, and
   a voltage rise of the output voltage is controlled by the input voltage and the boosting ratio.

5. The DC power source according to claim 1, wherein,
   in the steady operation mode, any control is selectable from;
   constant voltage control where a set value of a steady operation is switched from the ignition set voltage being set in the ignition mode, to a steady operation set voltage, and the output voltage is maintained at the steady operation set voltage,
   constant current control where the set value of the steady operation is switched from the ignition set voltage being set in the ignition mode, to a steady operation set current, and an output current is maintained at the steady operation set current, and
   constant power control where the set value of the steady operation is switched from the ignition set voltage being set in the ignition mode, to steady operation set power, and output power is maintained at the steady operation set power, and the switching control by the controller switches the ignition mode to the steady operation mode and performs any control selected from the constant voltage control, the constant current control, and the constant power control, when the output current reaches the ignition set current and the output voltage drops to a plasma generation voltage.

6. A DC power source control method configured to supply DC power to a plasma generator, comprising a voltage source step-down chopper constituting a DC source, a boosting circuit configured to boost DC voltage of the voltage source step-down chopper, a single-phase inverter configured to convert a DC output from the boosting circuit to a single-phase AC, and a controller including a chopper controller configured to control the voltage source step-down chopper and a boosting controller to control the boosting circuit, the DC power source control method comprising, performing a switching control by switching between an ignition mode to supply ignition voltage that generates a plasma discharge in the plasma generator, and a steady operation mode to continue the plasma discharge in the plasma generator, and in the ignition mode, controlling by the boosting controller, output voltage that is applied to the plasma generator, by intermittently establishing a short-circuit between a positive voltage side and a negative voltage side of the boosting circuit and controlling a boosting operation according to a short-circuit current formed by the short-circuit.

7. The DC power source control method, according to claim 6, wherein, in the ignition mode, boosting control and constant voltage control are performed by the controller, with switching therebetween, and the boosting control is performed by the boosting controller to repeat boosting more than once according to the short-circuit current so as to raise the output voltage up to an ignition set voltage, and the constant voltage control is performed by the chopper controller to maintain the output voltage at the ignition set voltage, and the boosting control is switched to the constant voltage control, after the output voltage reaches the ignition set voltage.

8. The DC power source control method, according to claim 7, wherein, an on-duty cycle of the chopper control by the chopper controller, and the number of intermittent short-circuit operations in the boosting controller, are used as parameters, an input voltage of the voltage source step-down chopper is controlled by the on-duty cycle, a boosting ratio is controlled by the number of intermittent short-circuit operations, and a voltage rise of the output voltage is controlled by the input voltage and the boosting ratio.

9. The DC power source control method, according to claim 6, wherein, in the steady operation mode, any control is selectable from;

constant voltage control where a set value of a steady operation is switched from the ignition set voltage being set in the ignition mode to a steady operation set voltage, and the output voltage is maintained at the steady operation set voltage, constant current control where the set value of the steady operation is switched from the ignition set voltage being set in the ignition mode to a steady operation set current, and an output current is maintained at the steady operation set current, and constant power control where the set value of the steady operation is switched from the ignition set voltage being set in the ignition mode to steady operation set power, and output power is maintained at the steady operation set power, and the switching control by the controller switches the ignition mode to the steady operation mode, and performs any control selected from the constant voltage control, the constant current control, and the constant power control, when the output current reaches the ignition set current and the output voltage drops to a plasma generation voltage.

* * * * *